(12) United States Patent
Akcasu

(10) Patent No.: US 10,872,950 B2
(45) Date of Patent: Dec. 22, 2020

(54) METHOD FOR GROWING VERY THICK THERMAL LOCAL SILICON OXIDE STRUCTURES AND SILICON OXIDE EMBEDDED SPIRAL INDUCTORS

(71) Applicant: nanoHenry, Inc., San Diego, CA (US)

(72) Inventor: Osman Ersed Akcasu, San Diego, CA (US)

(73) Assignee: NanoHenry Inc., San Diego, CA (US)

( * ) Notice: Subject to any disclaimer, the term of this patent is extended or adjusted under 35 U.S.C. 154(b) by 0 days.

(21) Appl. No.: 16/685,979

(22) Filed: Nov. 15, 2019

(65) Prior Publication Data

US 2020/0105860 A1 Apr. 2, 2020

Related U.S. Application Data

(63) Continuation-in-part of application No. 16/217,229, filed on Dec. 12, 2018, now Pat. No. 10,510,828,
(Continued)

(51) Int. Cl.
*H01L 21/02* (2006.01)
*H01L 21/308* (2006.01)
(Continued)

(52) U.S. Cl.
CPC ........ *H01L 28/10* (2013.01); *H01L 21/02164* (2013.01); *H01L 21/02238* (2013.01);
(Continued)

(58) Field of Classification Search
CPC ......... H01L 21/02164; H01L 21/02238; H01L 28/10; H01F 5/003; H01F 41/041
See application file for complete search history.

(56) References Cited

U.S. PATENT DOCUMENTS 2,981,877 A 4/1961 Noyce
3,138,743 A 6/1964 Kilby
(Continued)

OTHER PUBLICATIONS

Cardinaud, Fluorine-based plasmas: Main features and application in micro- and nanotechnology and in surface treatment, C.R. Chimie 21 (2018) 723-739.
(Continued)

*Primary Examiner* — Mohsen Ahmadi
(74) *Attorney, Agent, or Firm* — Law Office of Gerald Maliszewski; Gerald Maliszewski

(57) ABSTRACT

A method is provided for fabricating thick silicon oxide structures, such as an embedded inductor. A Deep Reactive Ion Etch (DREI) etches the top silicon layer of a substrate to form high aspect ratio Si features, called trench texturing. The Si features are oxidized to form silicon oxide features. Adjacent Si features are separated by a trench width ($S(0)$), so that after oxidation, adjacent Si oxide features are formed separated by trench width ($S(t)$), where $S(t) \leq S(0)$ (e.g., $S(t)=0$). If the Si features have a width $W_{Si}(0) > 1.2728\ S(0)$, then the adjacent silicon oxide features form an amorphously merged silicon oxide feature with a planar top surface. The silicon oxide features have a height ($H_{Ox}(t)$) responsive to the trench width ($S(0)$), the Si feature width ($W_{Si}(t)$), and the Si feature aspect ratio. After oxidation, inductor metal is deposited in trenches where $W_{Si}(0) < 1.2728\ S(0)$.

15 Claims, 13 Drawing Sheets

Related U.S. Application Data which is a continuation-in-part of application No. 15/285,310, filed on Oct. 4, 2016.

(51) Int. Cl.
    *H01L 21/3065*     (2006.01)
    *H01F 17/00*     (2006.01)
    *H01F 41/04*     (2006.01)
    *H01L 49/02*     (2006.01)

(52) U.S. Cl.
    CPC ........ H01L 21/308 (2013.01); H01L 21/3065 (2013.01); *H01L 2924/1206* (2013.01); *H01L 2924/19042* (2013.01)

(56) References Cited

U.S. PATENT DOCUMENTS

| | | |
|---|---|---|
| 3,648,125 A | 3/1972 | Peltzer |
| 4,576,834 A * | 3/1986 | Sobczak ............... H01L 21/316 438/431 |
| 5,501,893 A | 3/1996 | Laermer et al. |
| 9,425,761 B2 | 8/2016 | Zuo et al. |
| 9,893,048 B2 | 2/2018 | Lan et al. |
| 2006/0215949 A1* | 9/2006 | Lipson ................... G02F 1/025 385/2 |
| 2013/0134553 A1* | 5/2013 | Kuo ........................ H01L 24/13 257/532 |
| 2013/0293337 A1* | 11/2013 | Lo ........................ H01F 41/041 336/200 |
| 2014/0044391 A1* | 2/2014 | Iizuka .................. H01S 5/0264 385/14 |
| 2015/0270237 A1* | 9/2015 | Chi ....................... H01L 21/486 257/737 |
| 2015/0376798 A1* | 12/2015 | Sakdinawat ........ B81C 1/00619 216/51 |
| 2016/0163451 A1* | 6/2016 | Wang .................... H01F 41/042 336/192 |
| 2016/0308020 A1* | 10/2016 | Sreenivasan ......... G02B 5/1857 |
| 2017/0330930 A1* | 11/2017 | Cook ..................... H01L 28/10 |
| 2018/0167054 A1 | 6/2018 | Berdy et al. |

OTHER PUBLICATIONS

Marty et al., Advanced etching pf silicon based on deep reactive ion etching for silicon high aspect ratio microstructures . . . , Microelectronics J 36 (2005) 673-677.

* cited by examiner

METHOD FOR GROWING VERY THICK THERMAL LOCAL SILICON OXIDE STRUCTURES AND SILICON OXIDE EMBEDDED SPIRAL INDUCTORS

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to silicon oxidation processes and, more particularly, to a silicon oxidation technique that permits the embedding of a high aspect ratio inductor in a thick film of silicon oxide.

2. Description of the Related Art

Growing $SiO_2$, commonly known as silicon dioxide or oxide, is one of the most important and well controlled key processing steps in silicon processing technology. Although Jack Kilby of Texas Instruments won the 1970 Nobel prize for inventing the first working integrated circuit in 12 Sep. 1958 using germanium [1], today's integrated circuits use planar integrated circuit made of single crystal silicon (Si), an invention dating Jul. 30, 1959 by Robert Noyce of Fairchild Semiconductor featuring reverse bias p-n junctions with $SiO_2$ device isolation being a key ingredient of his invention [2]. Fairchild Semiconductor's other pioneering inventions include the self-aligned silicon gate process for MOS (Metal Oxide Semiconductor) technology, which is the building block of all CMOS (Complementary Metal Oxide Semiconductor) integrated circuits of today, that uses $SiO_2$ as the gate oxide of the MOS transistors, and which have gate oxide thicknesses in the range of 2 to 12 nanometers (nm), depending on the supply voltage, effective gate length, desired threshold, and breakdown voltage requirements.

Table 1 is a list of typical CMOS transistor gate $SiO_2$ thicknesses, which gives an idea of thicknesses in the "very thin" oxide ranges for several conventional commercial CMOS processes [23].

TABLE 1

| Supply Voltage | Gate Length | Gate Oxide Thickness |
|---|---|---|
| 5 V | 0.5μ | 12 nm |
| 3.3 V | 0.35μ | 6.5 nm |
| 2.5 V | 0.25μ | 4.5 nm |
| 1.5 V | 0.18μ (180 nm) | 4 nm |
| 1.5 V | 100 nm | 3 nm |
| 1 V | 50 nm | 2 nm |

At the time of this writing, 45, 32, 20, 14, 10, and 7 nanometer (nm) processes are used in production by several manufacturers, including Intel, Samsung, TSMC, Global Foundries, and IBM. As can be seen in Table 1, gate oxide and supply voltage are scaled as the gate length is reduced, but the gate oxide cannot be made thinner than 1.5 nm due to the gate oxide tunneling (Fowler-Nordheim), which increases the gate leakage current to unacceptable levels. This problem is addressed through the introduction of high dielectric constant materials like $HfO_2$ (Hafnium dioxide, $\varepsilon_r=20$) into the gate $SiO_2$. The relative dielectric constant of Hafnium dioxide is 20 compared to the $SiO_2$ relative dielectric constant of 3.9, making it truly a high k dielectric.

In the oxide isolation process (Fairchild Semiconductor [25]), lateral isolation between devices is achieved by locally grown "thick local" $SiO_2$, with thicknesses on the order of 1 to 3 microns (μ), depending on the epitaxial thickness in the bipolar processes in which they are employed. For high voltage processes, where a thicker epitaxial thickness is required, the device-to-device lateral isolation can be performed using V-Groove isolation, again where thermally grown $SiO_2$ forms the inner walls of V-Grooves that are etched into silicon by an anisotropic silicon etch. After the invention of REI (Reactive Ion Etching), trenches etched in silicon, lined by thin thermal $SiO_2$, filled with polysilicon, and followed with oxide capping the polysilicon filled trenches, became a preferred form of isolation, giving a much higher device per area and became an element in other applications.

For all these inventions an understanding of the kinetics of the thermally grown $SiO_2$ is important. This key research was performed by Bruce E. Deal and Andy S. Grove, again of Fairchild in 1965 [3-5]. All these key Fairchild Semiconductor inventions helped created Silicon Valley companies such as Intel, AMD, and National Semiconductor, also known as "Fairchildren", with tightly controlled $SiO_2$ growth being a central building block of the technology.

The oxidation of silicon is performed in oxidation furnaces at temperature ranges of 800 to 1,200° C. [3-5, 24]. In "dry" oxidation the only gas present in the oxidation furnace is oxygen ($O_2$). The chemical reaction for dry oxidation is,

$$Si+O_2 \rightarrow SiO_2 \tag{1.1}$$

In "wet" or "steam" oxidation, there is steam present, in addition to $O_2$, in the oxidation furnace, which increases the $SiO_2$ growth rate. The chemical reaction for wet oxidation is,

$$Si+2H_2O \rightarrow SiO_2+2H_2 \tag{1.2}$$

Oxidation takes place at the $Si$—$SiO_2$ interface. The oxidizing species must diffuse through any previously formed oxide and then react with the silicon at the $Si$—$SiO_2$ interface. Therefore, growing a thicker oxide takes longer time. For short oxidation times the oxide thickness is determined by the surface reaction rate constant and is linearly proportional to the oxidation time. If the oxidation time is long the oxide growth is determined by the diffusion constant, and oxide thickness becomes proportional to the square root of the oxidation time.

FIGS. 1A through 1E are partial cross-sectional views depicting the growth of silicon oxide on a silicon film (prior art). As shown in FIG. 1A, if a bare silicon surface is oxidized, 44% of the oxide thickness ($T_{UP}$) will be above the original silicon surface and 56% of the oxide thickness ($T_{DOWN}$) occurs below the level of the original silicon surface.

FIG. 1B depicts the typical initial step in a local oxide growth process. A thin pad oxide growth is followed by $Si_3N_4$ (silicon nitride) deposition acting as oxygen mask. Masking and etching of the $Si_3N_4$ is performed for the desired local oxidation regions.

FIG. 1C depicts the final result of the local oxidation. Note the significant oxide encroachment towards the sides under the $Si_3N_4$ mask regions (Bird's Beak) in the order of the thickness of the grown oxide.

FIG. 1D depicts the typical initial step in a recessed local oxide growth process (prior art) which is aimed in reduce the oxide encroachment to the sides, but mainly creating a more planar surface, as compared to the process shown in FIG. 1C. A thin pad oxide growth is followed by $Si_3N_4$ deposition acting as oxygen mask. Masking and etching of $Si_3N_4$ is followed by the pad oxide etch, and finalized by an anisotropic silicon etch (KOH etch). Assuming a <100> orientation silicon, Wo (the width of the trench bottom)=Wsurface (the width of the trench at the Si top surface)–√2 t, where t is the depth of the trench in the Si.

FIG. 1E depicts the final result of the recessed local oxide process resulting in more planar local oxidation for thicker local oxides.

Table 2 shows the times needed for growing thin oxides, like the gate oxides with thicknesses of 2, 4, 10, and 100 nm under dry and wet oxidation conditions at 1,100, 1,000, and 800° C. with standard pressures using the Deal-Grove oxidation model [3-5, 24], see FIG. 15. As can be seen from the table, the adjustment of temperature, pressure, and time permits a very precise control over even 2 nm thick gate oxides.

TABLE 2

| $t_{ox}$(nm) | 1,100° C. | | 1,000° C. | | 800° C. | |
| --- | --- | --- | --- | --- | --- | --- |
| | Wet | Dry | Wet | Dry | Wet | Dry |
| 2 | 00:00:02 | 00:00:43 | 00:00:09 | 00:02:44 | 00:05:19 | 01:21:16 |
| 4 | 00:00:05 | 00:01:28 | 00:00:19 | 00:05:30 | 00:10:39 | 02:42:55 |
| 10 | 00:00:10 | 00:03:50 | 00:00:50 | 00:14:07 | 00:26:41 | 06:50:07 |
| 100 | 00:03:13 | 01:01:21 | 00:10:04 | 03:13:06 | 04:33:17 | 75:19:59 |

(hour:minute:second)

As mentioned earlier and as shown in Table 3, growing $SiO_2$, thicker than 3μ is very time consuming and difficult, making the growth of thermal oxide thicknesses of than 3μ is very rare and non-practical, if not non-existing. Since $SiO_2$ has very high dielectric breakdown electric field strength of $10^7$ volts per centimeter (V/cm), a 1μ thickness of $SiO_2$ can block 1,000 Volts, a measurement referred to as breakdown voltage [24]. For conventional semiconductor isolation purposes there is also no need for silicon oxide thicknesses of greater than 2μ, which would provide a 2,000V breakdown voltage, greater than is known for almost all high voltage silicon applications.

Table 3 shows the times required for thick $SiO_2$ growth. Since dry oxidation is far slower than wet oxidation, Table 3 is constructed only for wet oxidation and it shows time needed for growing 1, 2, 4, 8, 16, and 32μ thicknesses of $SiO_2$ at 1,100, 1,000, and 800° C. under standard pressures, again using Deal-Grove oxidation model. As can be seen in Table 3, growing thicker than 4μ of $SiO_2$ requires oxidation times measured in days. A 32μ $SiO_2$ thickness takes 80 days to 568 days (1.55 years) depending on the oxidation temperature.

TABLE 3

(Brigham Young University (BYU) Cleanroom 2019)

| $T_{OX}$(μ) | 1,100° C. (Wet) | 1,000° C. (Wet) | 800° C. (Wet) |
| --- | --- | --- | --- |
| 1 | 02:14:18 | 04:31:52 | 56:11:06 |
| 2 | 08:15:30 | 15:24:41 | 136:21:42 |
| 4 | 31:38:23 | 56:12:27 | 368:21:22 |
| 8 | 123:46:05 | 213:56:41 | 1,118:54:37 |
| 16 | 489:29:16 | 833:59:48 | 3,766:16:45 |
| 32 | 1,941:46:46 | 3,292:24:43 | 13,646:03:31 |

(hour:minute:second)

Using high pressure wet oxidation reduces the oxidation times significantly, as compared to the oxidation times shown in Table 3, but growing thicknesses of greater than 4μ of $SiO_2$ is not a practical option [24]. It should be noted that these calculations are theoretical and another problem in growing thick local oxide is the creation of oxidation induced stacking faults and dislocations that can crack the substrate or degrade in later stages of the process following oxidation, causing yield loss if the stresses are not relieved. On the other hand, if very thick "blanket" thermal $SiO_2$ could be grown efficiently in a short time, it would open many doors in very specific device technologies, especially in the MEMS (Micro-Electro-Mechanical Systems) space [22].

The following references provide supplemental and background information for this invention, and are incorporated herein by reference:

1. "Miniaturized Electronic Circuits", J. S. Kilby, U.S. Pat. No. 3,138,743, Jun. 23, 1964, filing date, Feb. 6, 1959.
2. "Semiconductor Device-and-Lead Structure", R. N. Noyce, U.S. Pat. No. 2,981,877, Apr. 2, 1961, filing date, Jul. 30, 1961.
3. Bruce E. Deal and Andy. S. Grove, "General Relationship for the Thermal Oxidation of Silicon," J. Appl. Phys., 36, 3770 (1965).
4. "Physics and Technology of Semiconductor Technology", Andy S. Grove, Willey International Edition, 1967, ISBN-13 978 0471329985.
5. E. H. Nicollins and J. R. Brews, MOS Physics and Technology, New York: Wily, 1952.
6. "Miniature Inductors and Related Circuit Components and Methods of Making Same", O. E. Akcasu, US2018/0096777 A1, Apr. 5, 2018.
7. "Miniature Inductors and Related Circuit Components and Methods of Making Same", O. E. Akcasu, WO 2018/067594 A1, 12 Apr. 2018.
8. "Capacitor with High Aspect Ratio Silicon Cores", O. E. Akcasu, US 2018/34559432, Dec. 12, 2018.
9. "Method of Anisotropically Etching Silicon", Franz Laermer, Andrea Schilp, U.S. Pat. No. 5,501,893, Mar. 26, 1996.
10. "Maximum Achievable Aspect Ratio in Deep Reactive Ion Etching of Silicon due to Aspect Ratio Dependent Transport and Microloading Effect", Junghoon Yeom, Yan Wu, John C. Selby and Mark A. Shannon, Journal of Vacuum Sci. Technol. B 23(6), November/December 2005, pp. 2319-2329.
11. "Very High Aspect Ratio Deep Reactive Ion Etching of Sub-micrometer Trenches in Silicon", Jayalakshmi Parasurman, Anand Summanwar, Frederic Marty, Philippe Basset, Dan E. Angelescu and Tarik Bourouina, IEEE Journal of Micromechanical Systems, 2012-0181
12. "Passive-on-Glass (POG) Device and Method", Je-Hsiung Jeffrey Lan, Niranjan Sunil Mudakatte, Changhan Hobie Yun, Daeik Daniel Kim, Chenjie Zuo, David Francis Berdy, Mario Francisco Valez and Jonghae Kim, U.S. Pat. No. 9,893,048 B2, Feb. 13, 2018.

13. "High Pass Filters and Low Pass Filters using Through Glass via Technology", Chegjie Zuo, Jonghae Kim, Changhan Hobie Yun, Dacik Daniel Kim, Mario Francisco Valez, Je-Hsiung Lan, Robert Paul Mikula and Matthew Michael Nowak, U.S. Pat. No. 9,425,761, B2, Aug. 23, 2016.
14. "Hybrid Passive-on-Glass (POG) Acoustic Filter", David Francis Berdy, Changhan Hobie Yun, Shiqun Gu, Niranjan Sunil, Mudakatte, Mario Francisco Valez, Chengjie Zuo, and Jonghae Kim, US2018/0167054A1, Jun. 14, 2018.
15. "Modeling, Design, Fabrication and Demonstration of RF Front-End 3d IPAC Module with Ultra-thin Glass Substrates for LTE Applications", Junki Min, Zihan Wu, Markondeya Raj Pulugurtha, Vanessa Smet, Venky Sundaram and Rao Tummala, Arjun Ravindran and Christian Hoffman, 2016 IEEE 66th Electronic Components and Technology Conference, pp. 1297-1301.
16. "Miniaturized Bandpass Filters as Ultrathin 3-D IPDs and Embeded Thinfilms in 3-D Glass Modules", Srikrishna Sitaraman, Vijay Sukumaran, Markondeya Raj Pulugurtha, Zihan Wu, Yaya Suziki, Yongwoo Kim, Venky Sundaram, Joungho Kim and Rao Tummala, IEEE Transactions on Components, Packaging and Manufacturing Technology, VOL. 7, NO. 9, September 2017, pp. 1410-1418.
17. "Ultrathin High-Q 2-D and 3-D RF Inductors in Glass Packages", Min Suk Kim, Markondeya Raj Pulugurtha, Venky Sundaram, Rao Tummala and Hobie Yun, IEEE Transactions on Components, Packaging and Manufacturing Technology, VOL. 8, NO. 4, April 2018, pp. 643-651.
18. "Ultra-High I/O Density Glass/Silicon Interposers for High Bandwidth Smart Mobile Applications", Gomul Kumar, Tapobrata Bandyopadhyay, Vijay Sukumaran, Venky Sundaram, Sung Kyu Lim and Rao R. Tummala, 2011 Electronic Components and Technology Conference.
19. "Engineering Electromagnetic Fields and Waves," Carl T. A. Johnk, John Willey & Sons, Copyright 1975, ISBN 0-471-44289-5.
20. "Elements of Electromagnetics," Matthew N. O. Sadiku, Oxford University Press, Copyright 2001 Third Edition, 2001, ISBN 0-19-513477-X.
21. "The Feynman Lectures on Physics", Richard P. Feynman, Robert B. Leighton, Matthew L. and Sands, Copyright 1963, 1989 California Institute of Technology, ISBN 0-201-51003-0, Vol. II, pp. 7-9.
22. "History of MEMS", http://scme-nm.org/files/History%20of%20MEMS_Presentation.pdf
23. "Gate Oxide Scaling Limits and Projection", Chenming Hu, IEDM 1996, pp. 319-322.
24. "The Physics of Microfabrication", Ivor Brodie and Julius J. Muray, Copyright 1982, Plenum Press, New York, ISBN 0-306-40863-5.
25. "Method of Fabricating Integrated Circuits with Oxidized Isolation and the Resulting Structure", Douglas L. Peltzer, U.S. Pat. No. 3,648,125, Mar. 7, 1972, filing date, Feb. 2, 1971.

It would be advantageous if mechanisms existed for growing extremely thick layers of silicon oxide in short periods of time using conventional thermal oxidation chambers.

It would be advantageous if thick layers of silicon oxide could be grown without the oxide encroaching into regions of silicon underlying a mask (i.e., the bird's beak phenomena).

It would be advantageous if the above-mentioned thick oxide process could be used to embed and, thus, protect the mechanical integrity of high aspect ratio metal structures, such as an inductor.

SUMMARY OF THE INVENTION

Disclosed herein are structures and fabrication methods relating to thermally grown very thick silicon dioxide ($SiO_2$), on the order of 3-500 microns (u) thick, as thick as wafer device layer thicknesses, a previously impractical thickness range. One application of this process is in the making of miniature spiral inductors using High Aspect Ratio Metal and Spacing technology known as HARMS [6,7] and modified HARMS [8] processes. Using $SiO_2$ at these thicknesses, the HARMS inductors are completely embedded in the thermally grown $SiO_2$, providing definitive performance and integration advantages over conventional inductors due to their very planar structure. Using shallower trenches and conservative aspect ratios, the oxide fabrication process can also be used in very low stress and small footprint LOCal Oxidation of Silicon (LOCOS) [24, 25] for Complementary Metal Oxide Semiconductor (CMOS) processes.

Accordingly, a method is provided for fabricating a silicon oxide structure. The method provides a substrate having a top surface, with an overlying silicon (Si) layer having a top surface. Using a Deep Reactive Ion Etch (DREI) process, of which the Bosch process is an example, which can etch silicon with highly vertical walls and make high density very high aspect ratio (depth-to-width and depth-to-adjacent trench space) aspects ratios, such as 25-50 or even higher [9-11]. In the Bosch process the unmasked region of the silicon goes through alternating etch ($SF_6$)/passivation ($C_4F_8$) steps, both performed in a plasma reactor. This process is also called a "pulsed gas" or "time-multiplexed alternating" plasma etching process. The etched walls are highly vertical having slopes of 1° from the vertical, but the etch sidewalls have series of scallop shaped periodic notches along the height of the etched silicon feature. The scalloping peak-to-valley roughness can introduce problematic issues for the further metal deposition steps. The scalloping peak-to-valley roughness can be reduced below 40 nm ($10^{-9}$ m) with shorter switching times between etch and passivation. Even better roughness can be achieved followed with some additional simple processing steps. Another version of the DREI process is $SF_6$—$O_2$ cryogenic plasma etch process which leaves chemically clean surface on the etch sidewalls compared to the standard Bosch process. It is a simultaneous etch and passivation process performed at −110° C. and has more demanding process control parameters. In response to the DREI process, a Si feature is formed with a proximal end extending from the substrate top surface, a distal end, a height ($H_{Si}(0)$), a perimeter, a width ($W_{Si}(0)$), as measured in a cross-section of the perimeter at the proximal end. In one aspect, the Si feature has an aspect ratio of height to width of greater than 5:1. The difference of width between the proximal and distal ends is less than 10%. The feature perimeter may have any number of different shapes, such as a square, circular, oval, or polygon shaped pillar, a ridge (fence), or a shaped ridge.

The Si feature is oxidized to grow a silicon oxide ($SiO_2$) film overlying the Si feature having a thickness ($T_{OX}(t)$), ultimately forming a silicon oxide feature with a proximal end extending from the substrate top surface, a distal end, a height, a perimeter, and a width, as measured in a cross-section of the perimeter at the proximal end. In one aspect, the Si oxide feature has an aspect ratio of height ($H_{OX}(t)$) to width ($W_{OX}(t)$) of greater than 5:1. The difference of width between the proximal and distal ends is less than 10%. The Si oxide feature has a height $H_{OX}(t)=H_{Si}(0)+$about 0.44 ($T_{OX}(t)$) and a width $W_{OX}(t)=W_{Si}(0)+$about 0.88 ($T_{OX}(t)$). More typically, a plurality of adjacent Si features may be formed, with adjacent Si feature perimeters are separated by a trench width (S(0)), so that after oxidation a plurality of adjacent Si oxide features are formed separated by trench width (S(t)), where S(t)<S(0). In one aspect, S(t)=0. If the Si features have a width $W_{Si}(0)=$about 1.2728 S(0), then adjacent silicon oxide features share coincident perimeters. If the Si features have a width $W_{Si}(0)>$about 1.2728 S(0), then the adjacent silicon oxide features form an amorphously merged silicon oxide feature with a planar top surface, forming an interlocking continuous thermal oxide region as thick as the device layer in the bonded SOI wafer covering the entire textured region. Due to the nature of the process, the thick thermal oxide growth process explained herein may be referred to as iLOCTS or ILOCTS, which is the abbreviation for Inter-Locking Oxidation of Critically Textured Silicon. As explained in more detail below, the silicon oxide features have a height ($H_{OX}(t)$) responsive to the trench width (S(0)), the Si feature width ($W_{Si}(t)$), and the Si feature aspect ratio.

In other aspects, the Si oxide features may retain a Si core internal to the silicon oxide feature, with a proximal end extending from the substrate top surface, a distal end, a height ($H_{Si}(t)$), a perimeter, and a width ($W_{Si}(t)$), as measured in a cross-section of the perimeter at the proximal end:

$$W_{Si}(t)=W_{Si}(0)-\text{about } 1.12(T_{OX}(t)); \text{ and,}$$

$$H_{Si}(t)=H_{Si}(0)-\text{about } 0.56(T_{OX}(t)).$$

In one aspect, the Si oxide features may have an aspect ratio of height to width of greater than 5:1.

Also provided is a method for fabricating a silicon oxide embedded inductor. This requires etching a spiral inductor layout with vertical or nearly vertical walls into the thick oxide grown and filling it with metal. To date, high aspect ratio trenches having steep walls, where the difference of the trench width between the top end and the bottom of the trench is less than 10%, cannot be etched in $SiO_2$ reaching a significant depth, unless using the method described herein. The method provides a substrate having a top surface, with an overlying silicon layer having a top surface. The silicon layer top surface is masked to form a first plurality of exposed regions having a width $S_1(0)$ and an exposed path region (e.g., spiral shape) having a width $S_2(0)$, where $S_2(0)>S_1(0)$. Since there is no known method of etching a high aspect ratio trench with vertical walls in a thick $SiO_2$, an opposite approach is used. Instead of trying to etch a thick $SiO_2$, silicon is etched along with the texture etch in the desired path, void, via or any shape desired in the $SiO_2$. Since there is no silicon left to be oxidized in those void regions after the oxidation, the void regions are surrounded by highly vertical oxide regions created by the interlocking $SiO_2$ of the textured silicon. Using the DREI process, the exposed regions of Si layer are etched. In response to the DREI process, a plurality of Si features are formed with a proximal end extending from the substrate top surface, a distal end, a height ($H_{Si}(0)$), a perimeter, a width ($W_{Si}(0)$), as measured in a cross-section of the perimeter at the proximal end. In one aspect, the Si features have an aspect ratio of height to width of greater than 5:1. The difference of width between the proximal and distal ends is less than 10%. The Si features are oxidized to grow a silicon oxide ($SiO_2$) film overlying the Si features having a thickness ($T_{OX}(t)$), thus forming a silicon oxide layer from silicon oxide features having a proximal end extending from the substrate top surface, a distal end, a height, a perimeter, and a width, as measured in a cross-section of the perimeter at the proximal end. The difference of width between the proximal and distal ends is less than 10%, and where $W_{OX}(t)$ is about equal to $S_1(0)/2$. In one aspect, the Si oxide features have an aspect ratio of height ($H_{OX}(t)$) to width ($W_{OX}(t)$) of greater than 5:1. A metal conductor is deposited covering the silicon oxide feature sidewalls and trench bottom associated with the exposed path region, forming an electrically conductive path embedded in the silicon oxide layer. The metal conductor may form metal conductor wings extending from the silicon oxide sidewalls over the silicon oxide layer top surface, and in some aspects the metal conductor completely fills the trench. Electrical terminals can be formed on the silicon oxide layer top surface at the ends of the electrically conductive path, and in one aspect these terminals are electrically connected to an overlying interposer substrate.

As noted above, the Si oxide layer may be formed from amorphously merged Si oxide features. In one aspect, the Si oxide features may have internal Si cores. In one case, such as when the Si oxide features do not share coincident perimeter boundaries, a thin Si film, e.g., polysilicon, may be deposited overlying the silicon oxide features and oxidized.

Additional details of the above-described methods, silicon oxide structures, and an exemplary silicon oxide embedded inductor are provided below.

BRIEF DESCRIPTION OF THE DRAWINGS

FIGS. 12A through 12F depict steps in the fabrication a silicon oxide embedded inductor using the texture patterns of FIGS. 11A and 11B.

DETAILED DESCRIPTION

Figure 1A:
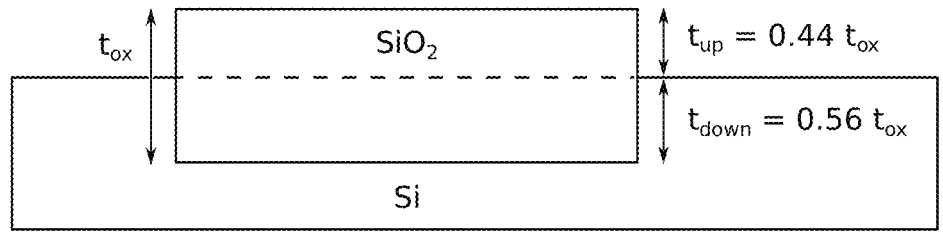
FIGS. 1A through 1E are partial cross-sectional views depicting the growth of silicon oxide on a silicon film (prior art).
Figure 1B:
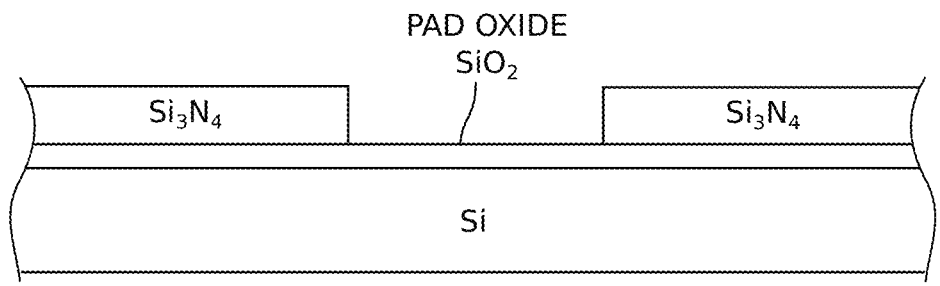
Figure 1C:
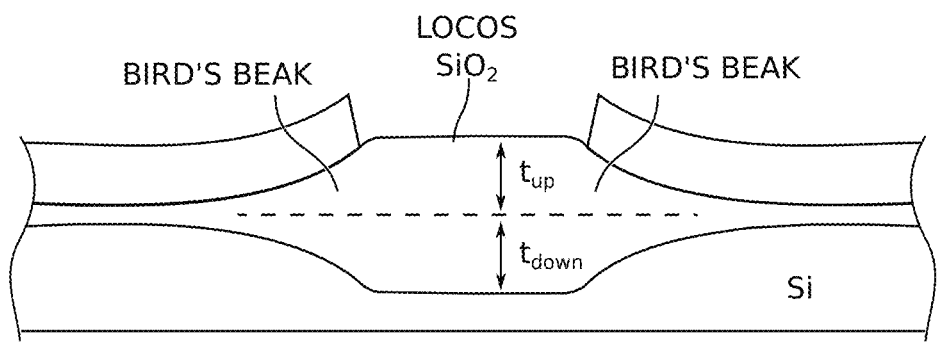
Figure 1D:
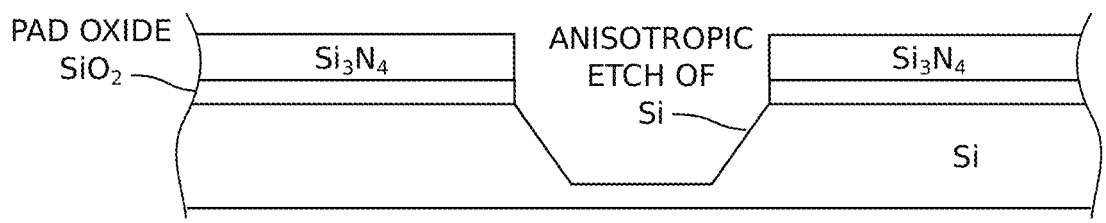
Figure 1E:
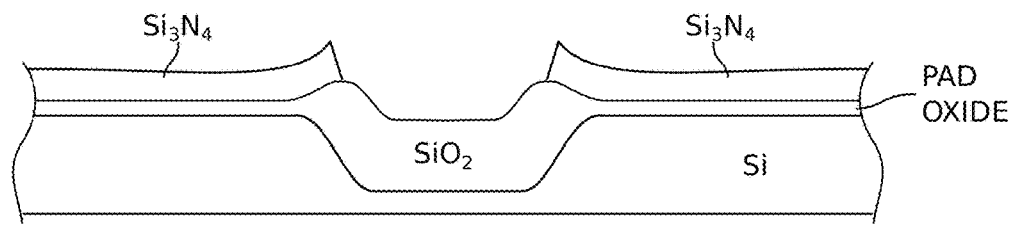

FIGS. 2A through 2D are partial cross-sectional views of a silicon oxide structure. The silicon oxide structure 200 comprises a substrate 202 having a top surface 204. One common example of a substrate is a Silicon on Insulator (SOI) substrate, which includes a buried insulating layer of silicon dioxide (SiO$_2$) and an underlying silicon (Si) layer 206, which may be used as a handling wafer and which may ultimately be discarded. Sapphire is also a common insulator material as used in Silicon on Sapphire (SOS) technology. Otherwise, the substrate may even be glass or even bulk silicon. Using a bonded SOI wafer as the substrate naturally introduces a buried SiO$_2$ (BOX) layer which acts like a DREI etch stop layer and eliminates the density and area/geometry dependencies of the etch rate of the DREI process [9-11]. Another advantage of having a buried SiO$_2$ (BOX) is that it will act as a "stress-relief layer" in the following oxidation cycle allowing only lateral SiO$_2$ growth in the textured silicon. In a SOI substrate for example, a top or device layer of Si, not shown, typically overlies the insulating layer 202. As explained in more detail below, this Si layer may be fully oxidized to become silicon dioxide feature 210. The silicon dioxide (SiO$_2$) feature 210 has a proximal end 212 extending from the substrate top surface 204, a distal end 214, a height (H$_{OX}$(t)) 216, a perimeter (see FIG. 3), and a width (W$_{OX}$(t)) 218, as measured in a cross-section of the perimeter at the proximal end. In one aspect, the silicon oxide feature has an aspect ratio of height (H$_{OX}$(t)) to width (W$_{OX}$(t)) of greater than 5:1. The difference of width between the proximal and distal ends is less than 10%. However, as explained below, in some aspects a width difference of greater than 10% may be preferred. For simplicity and convenience, the term "silicon oxide" as used below may be understood to be silicon dioxide. Note: due to the high aspect ratios involved, not all the drawings are not to scale.

Figure 2A:
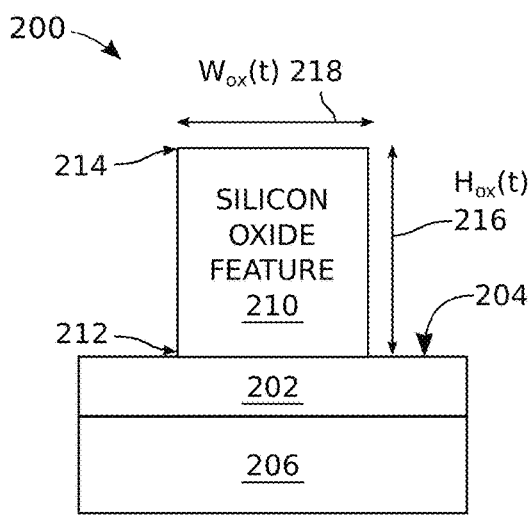
FIGS. 2A through 2D are partial cross-sectional views of a silicon oxide structure.
Figure 2B:
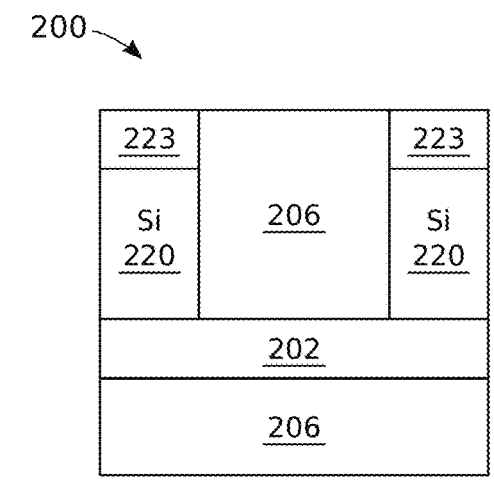

FIG. 2A depicts a stand-alone silicon oxide feature 210. The structures of FIGS. 2B, 2C, and 2D further comprise Si sidewalls 220 having a height (H$_{Si}$(t)) 222, with the silicon oxide feature 210 interposed between the Si sidewalls. During oxidation, a layer of silicon oxide (T$_{OX}$(t)) 223 may be grown over the Si structures, as shown. FIG. 2B depicts the Si sidewalls 220 and Si oxide feature sharing coincident perimeters (there is no gap between the Si sidewalls and the silicon oxide feature). In one example, the silicon oxide feature 210 has a height (H$_{OX}$(t)) of 50 microns and a width (W$_{OX}$(t)) of 2 microns between the Si sidewalls 220, and the breakdown voltage as measured between the Si sidewalls is greater than 2000 volts.

Figure 2C:
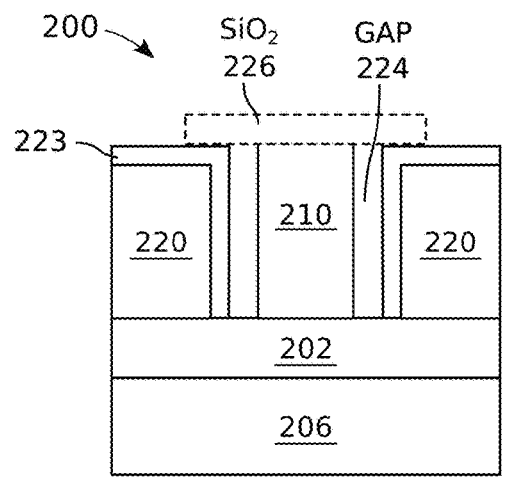

FIG. 2C depicts a gap or cavity 224 formed by the adjacent perimeters. As shown in phantom, a thin layer of silicon oxide 226 may be formed over the silicon oxide feature 210, using convention polysilicon deposition and oxidation processes, so as to cover the cavities 224. With a small enough gap, the combination of the silicon oxide feature 210 and silicon oxide layer 226 act as a thick silicon oxide layer, similar to the silicon oxide layer of FIG. 2B. Otherwise, a planar Si or Si oxide chip 226 can be deposited to cover the gaps while creating a planar top surface on the structure.

Figure 2D:
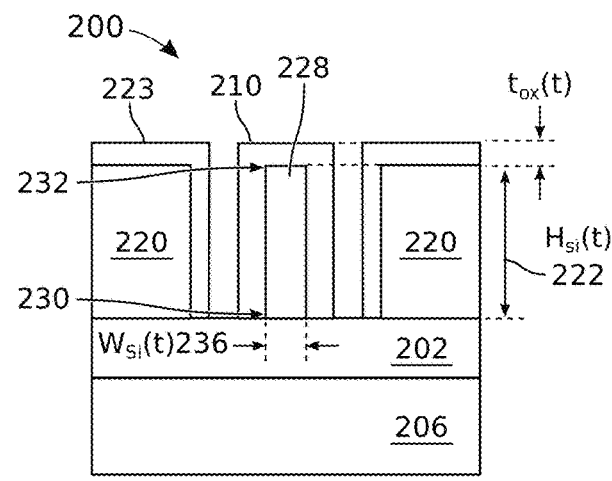

FIG. 2D depicts a Si core 228 internal to the silicon oxide feature 210, with a proximal end 230 extending from the substrate top surface 204, a distal end 232, a height (H$_{Si}$(t)) 222, a perimeter (see FIG. 3), and a width (W$_{Si}$(t)) 236, as measured in a cross-section of the perimeter at the proximal end. In one aspect, the Si core 228 has an aspect ratio of height to width of greater than 5:1, The difference of width between the proximal and distal ends is less than 10%, where:

$H_{OX}(t) = H_{Si}(t)$ + silicon oxide thickness $(T_{OX}(t))$; and, $W_{OX}(t) = W_{Si}(t) + 2(T_{OX}(t))$.

Figure 3:
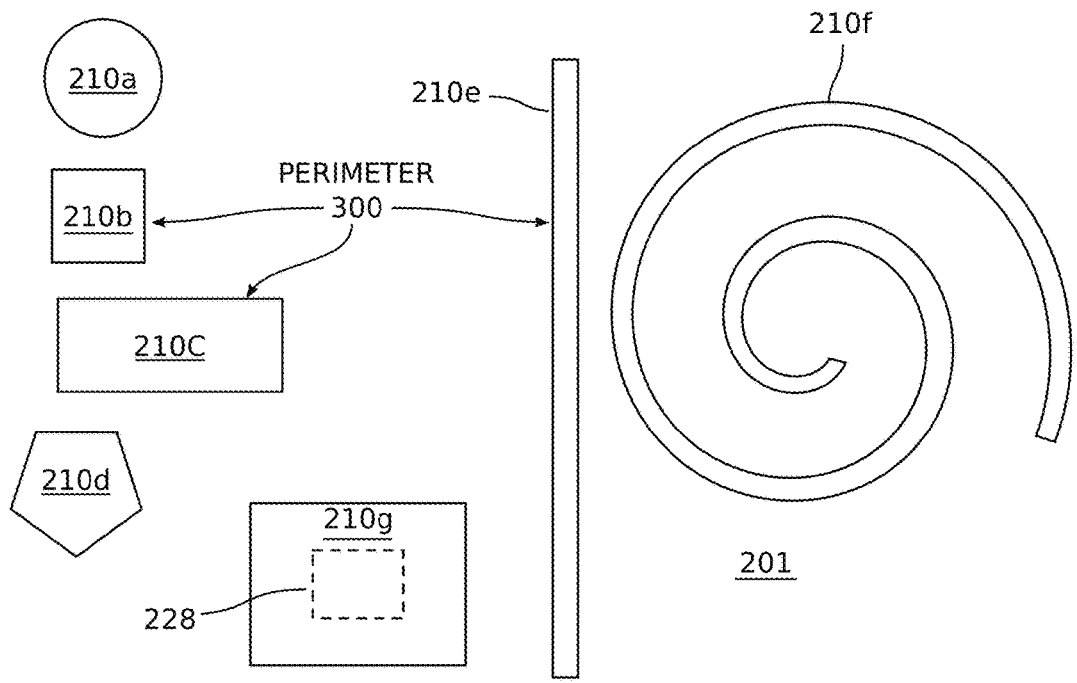
FIG. 3 is a plan view depicting exemplary silicon oxide feature perimeter shapes.

FIG. 3 is a plan view depicting exemplary silicon oxide feature perimeter shapes. Silicon oxide feature 210a has a perimeter 300 in the shape of a circle, silicon oxide feature 210b has a perimeter is the shape of a square, silicon oxide feature 210c has the perimeter shape of a rectangle, silicon oxide feature 210d has the perimeter shape of a polygon. A 5-sided polygon is depicted, but there is no limitation to the types of polygons that may be enabled. Silicon oxide feature 210e has the perimeter 300 shape of a ridge or fence. Silicon oxide feature 210f has the perimeter 300 shape of a shaped ridge. A spiral shaped ridge is shown, but there is no particular limitation to ridge shapes that may be used. Silicon oxide feature 210g includes a silicon core 228 (in phantom). The perimeter shape of the silicon core 228 determines the perimeter shape of the silicon oxide feature. Although a square perimeter shape is shown as an example, there is no particular limitation associated with the type of Si core perimeter shapes that may be used.

Figure 4A:
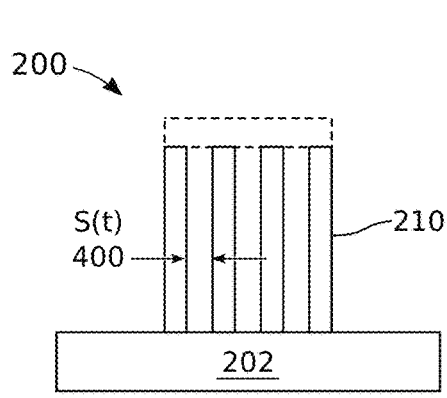
FIGS. 4A through 4G are partial cross-sectional views depicting a silicon oxide structure comprising of a plurality of adjacent silicon oxide features.
Figure 4B:
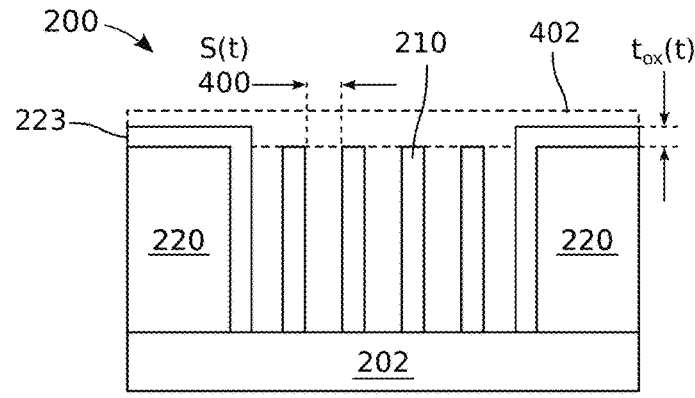
Figure 4C:
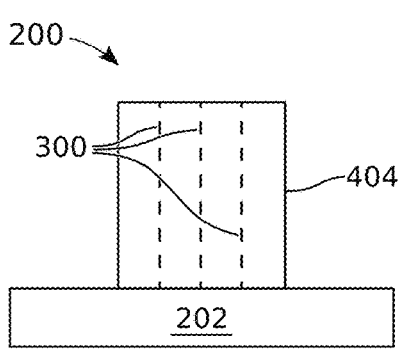
Figure 11A:
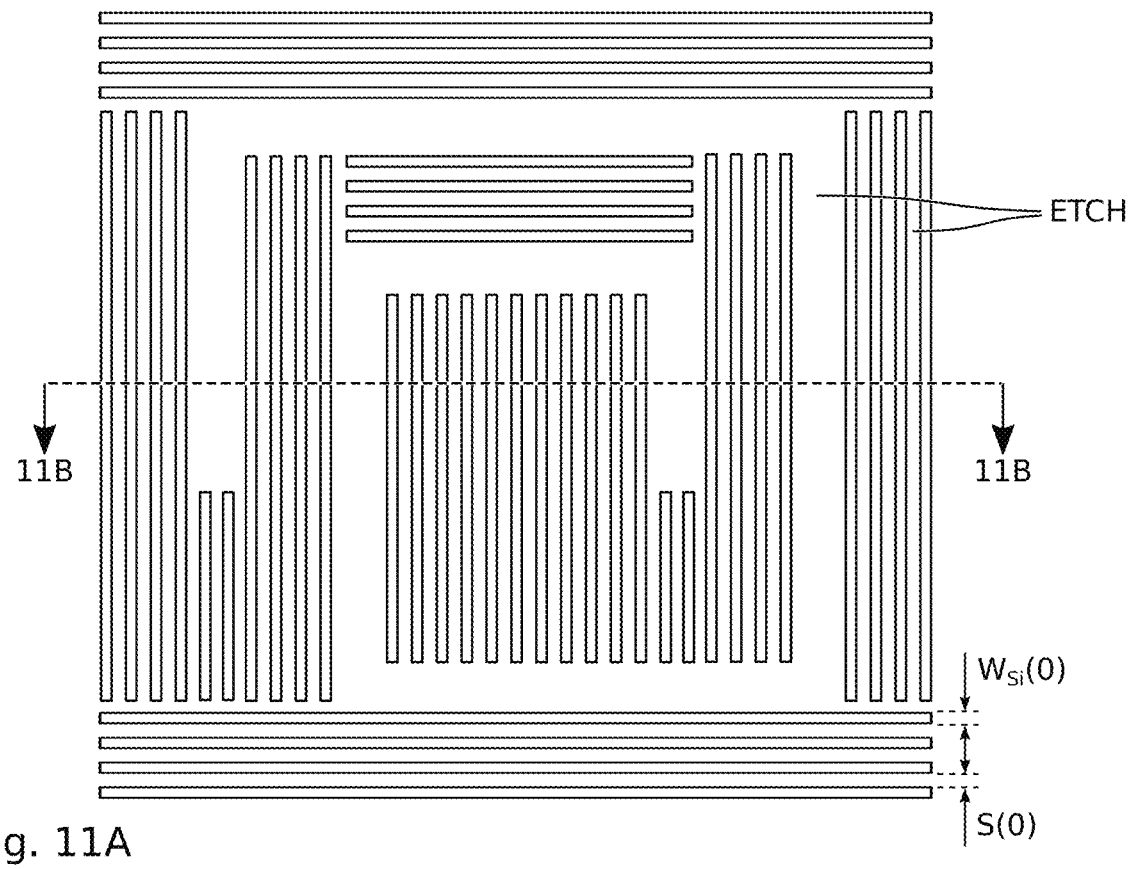
FIGS. 11A and 11B are, respectively, plan and partial cross-sectional views of exemplary texture (Si etch) patterns possible for creating a silicon oxide embedded inductor.
Figure 11B:
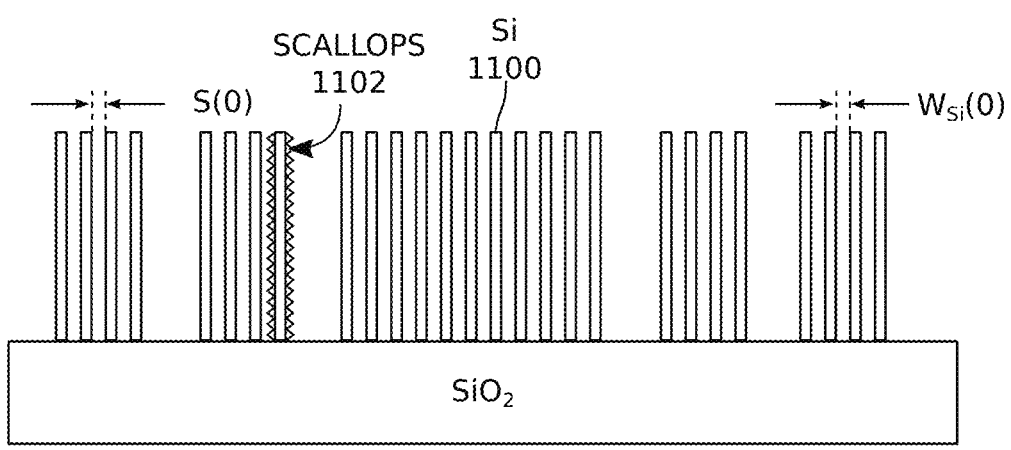

FIGS. 4A through 4G are partial cross-sectional views depicting a silicon oxide structure comprising of a plurality of adjacent silicon oxide features. In FIG. 4A the silicon oxide features 210 have perimeters separated by a trench width (S(t)) 400, where S(t)>0. It is also true that S(t)≤S(0), as shown in FIG. 11B, where S(0) is the trench width between Si features prior to oxidation, as explained in detail below. FIGS. 4A and 4B depict the plurality of silicon oxide features where trench width S(t) is greater than zero. As in FIG. 2C, a thin layer of silicon oxide 402 (shown in phantom) may optionally cover the silicon oxide features 210. FIG. 4B depicts the structure of FIG. 4A with Si sidewalls 220 having the height H$_{Si}$(t). FIG. 4C depicts the silicon oxide structure 200 with S(t)=0. Alternatively stated, adjacent silicon oxide features share coincident perimeters. In one aspect, the adjacent silicon oxide features 210 with shared coincident perimeters form an amorphously merged silicon oxide layer having a planar top surface 404. As used herein, the term "planar" defines a surface with a variance in uniformity of less than 100 Angstroms.

Figure 4D:
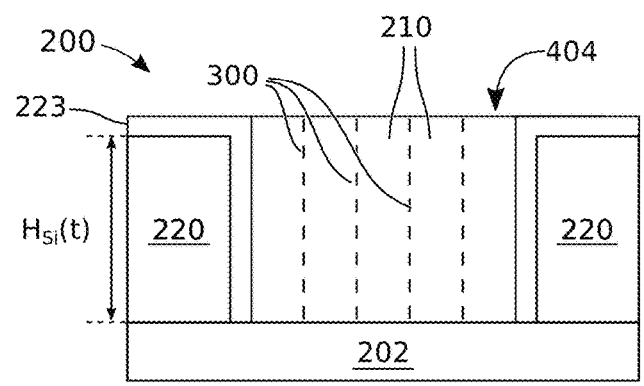

FIG. 4D depicts a silicon oxide structure of FIG. 4C further comprising Si sidewalls 220 having a height (H$_{Si}$(t)) with the plurality of silicon oxide features 210 interposed between the Si sidewalls.

Figure 4E:
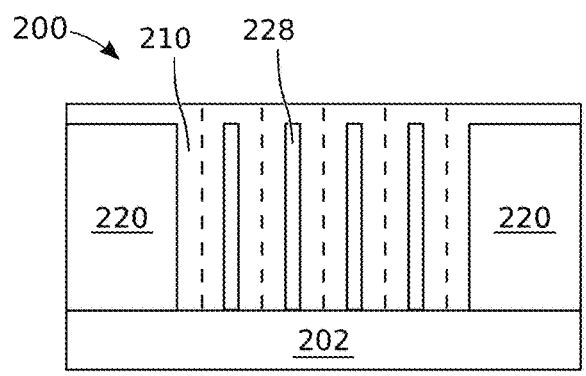
Figure 4F:
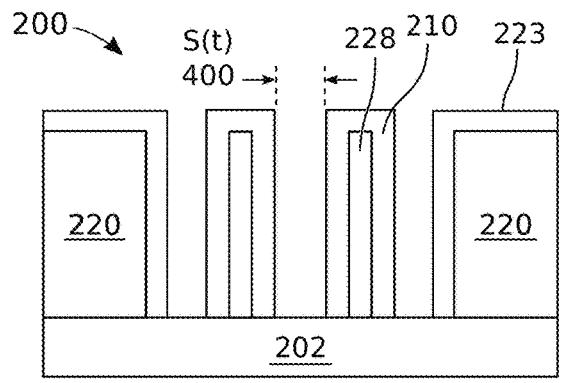

FIG. 4E depicts the silicon oxide structure of FIG. 4D, where the silicon oxide features 210 further comprise Si cores 228, with the silicon oxide features sharing coincident perimeters. FIG. 4F depicts the silicon oxide structure 200 of FIG. 4B with Si sidewalls 220 and Si cores 228 where a trench width S(t) 400>0 exists between the silicon oxide features.

Figure 4G:
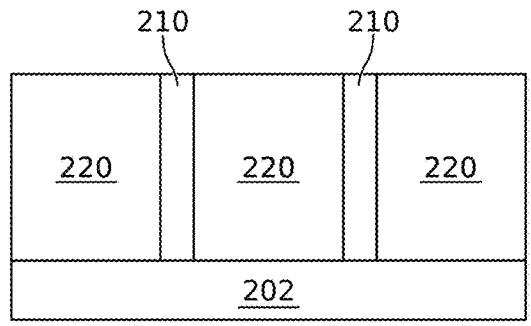

FIG. 4G depicts silicon oxide features 210 being used to isolate adjacent sections of silicon, such as silicon device regions where electrical components may be fabricated in subsequent fabrication processes. In this variation, the top surfaces of the silicon device regions were masked to prevent oxidation to prevent the formation of oxide over the device regions.

Figure 5A:
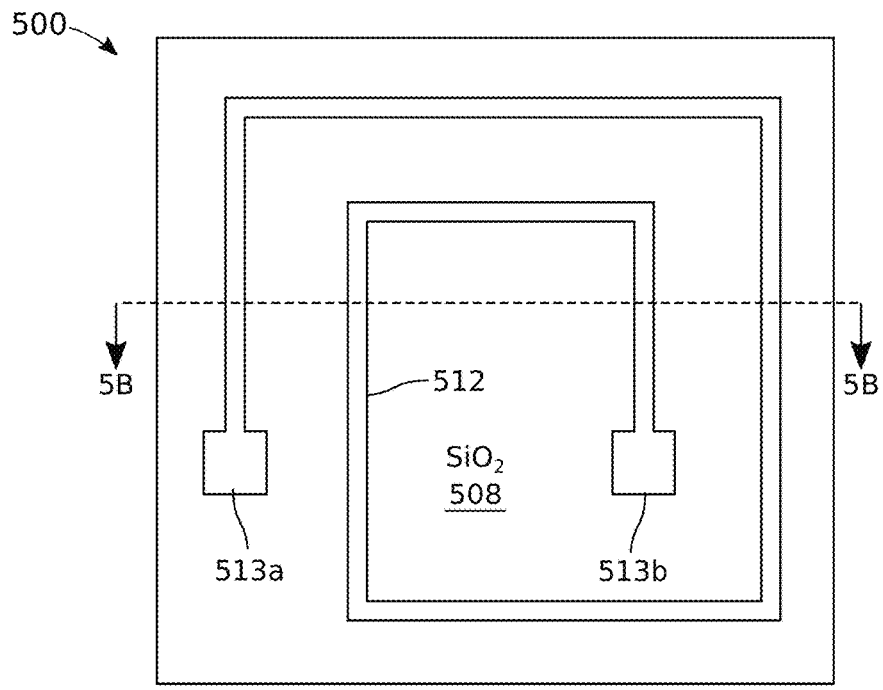
FIG. 5A is a plan view.
Figure 5B:
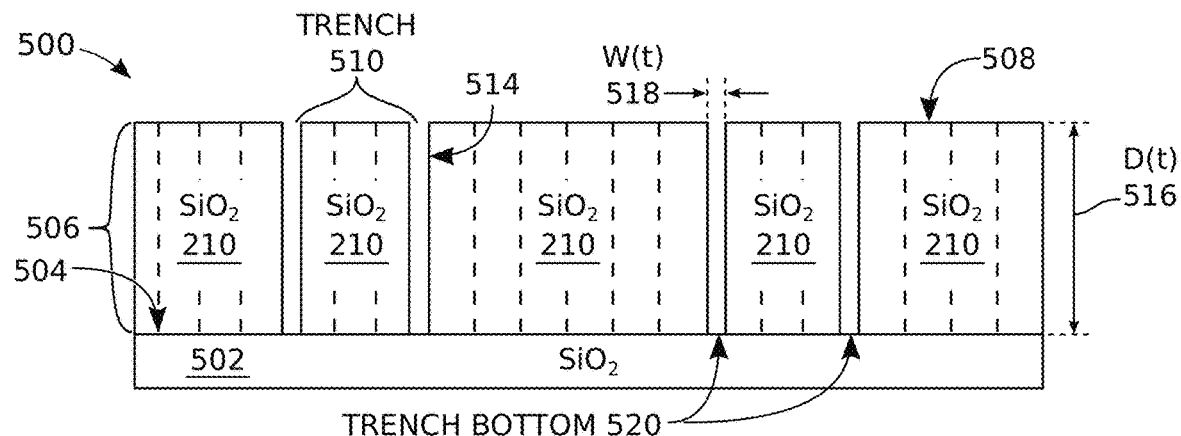
FIGS. 5B through 5F are partial cross-sectional views of an exemplary silicon oxide embedded spiral inductor.

FIG. 5A is a plan view, and FIGS. 5B through 5F are partial cross-sectional views of an exemplary silicon oxide embedded spiral inductor. The spiral inductor 500 comprises a substrate 502 with a top surface 504. As in the examples above, the substrate 502 may be silicon dioxide, such as the buried oxide layer of an SOI substrate. A silicon dioxide ($SiO_2$) layer 506 is formed overlying the substrate top surface having a top surface 508. The silicon oxide layer 506 may comprise a plurality of Si oxide features having coincident perimeters not shown here, but as can be seen as shown in FIG. 4D. In one aspect, the plurality of Si oxide features 210 are amorphously merged silicon oxide layer 506 having a planar top surface 508.

Etching a trench with high aspect ratio vertical walls in a thick $SiO_2$ layer, which is then filled with metal for use in building a spiral inductor, is not possible using conventional technologies. Conventionally, a deep Si trench might be filled with metal using silicon through via technologies (STV) employing atomic layer deposition or electroless plating along with advanced electro-plating techniques. A reverse approach is described herein. As explained in the fabrication process below, instead of etching thick $SiO_2$ after it is formed, the silicon is etched where the spiral metal windings are to be formed, at the same time as the texture pattern is etched, to subsequently grow the thick $SiO_2$. Since the same mask is used to create the texture and the winding, the process is self-aligned. In short, the spiral winding appears like void in the texture pattern as shown in FIG. 11A. This approach allows any width of metal formation having vertical walls in a thick $SiO_2$. For generating a path (metal) width of W, the width of the void can simply be $W+2T_{OX}$, where $T_{OX}$ is the "grown" oxide thickness. However, it should be noted that narrowness and aspect ratio of the path width is limited to the capabilities of the deep reactive ion etch (e.g., Bosch) process.

Figure 5C:
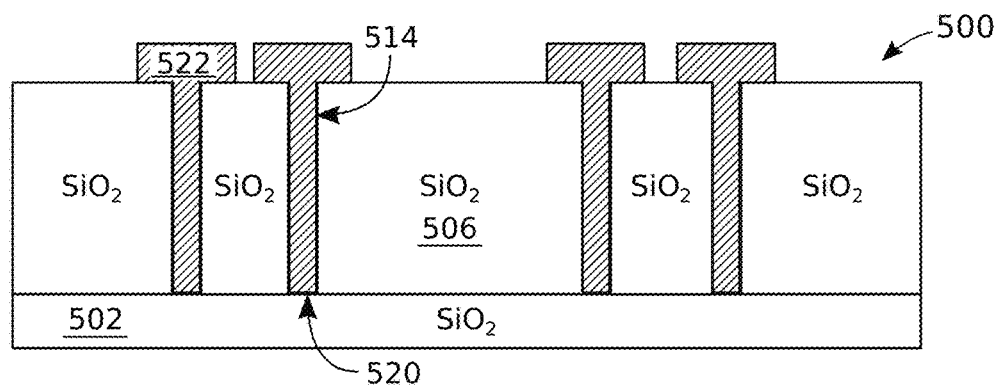
Figure 5D:
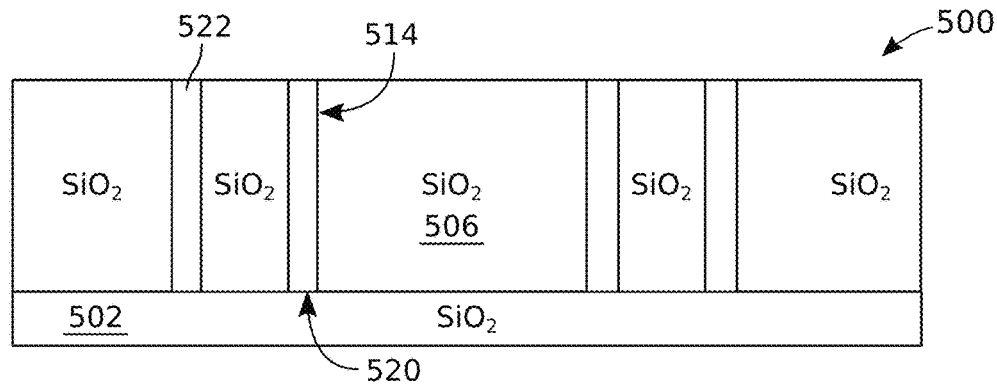
Figure 5E:
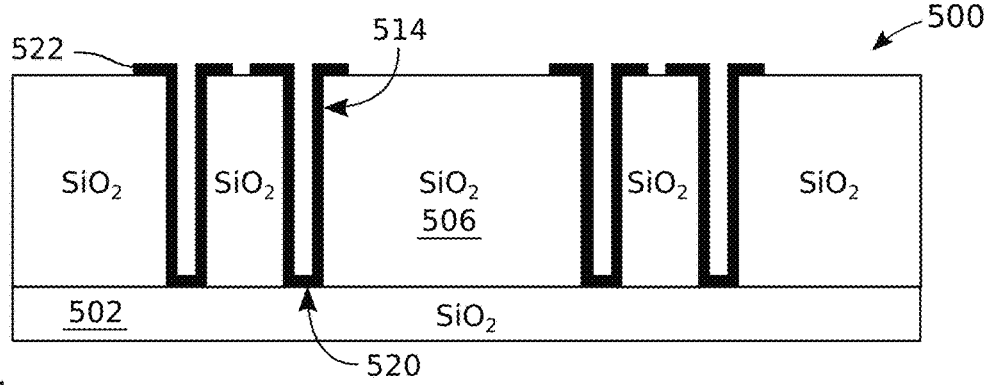

A trench or cavity 510 is formed in the silicon oxide layer 506 having a path length 512 with a first end 513a and a second end 513b, sidewalls 514, a depth ($D_T$) 516, and a width ($W_T$) 518, as measured at the trench bottom 520. For example, as shown, the path length 512 may be formed in the shape of a spiral to enhance inductance, although there is no particular limitation to the path length shape, which may for example form a square, rectangle, hexagon, octagon, or circular spiral. The difference of width between a trench opening at the silicon oxide layer top surface 508 and trench bottom 520 is less than 10%. In one aspect, the trench 510 has an aspect ratio of depth-to-width of greater than 5:1. As shown in FIGS. 5C-5E, a metal conductor 522 covers the trench sidewalls 514 and trench bottom 520. A difference in top and bottom trench widths as small as 5% is obtainable. However, larger trench width differences may improve the adherence of the metal to the trench sidewalls 514, and in some circumstances differences of larger than 10% may be preferred.

As shown in FIG. 5C, the metal conductor 522 includes wings 524 extending from the trench sidewalls 514 over the silicon oxide layer top surface 508. As shown in FIG. 5D, the metal conductor 522 completely fills the trench and is planarized to the level of the silicon oxide layer top surface. Not shown (see FIG. 12E), the metal conductor 522 may also fill the trench and have wings. As shown in FIG. 5E, the metal conductor 522 may only coat the trench sidewalls and trench bottom. The metal conductors 522 may include wings as shown, or have no wings (not shown).

Figure 5F:
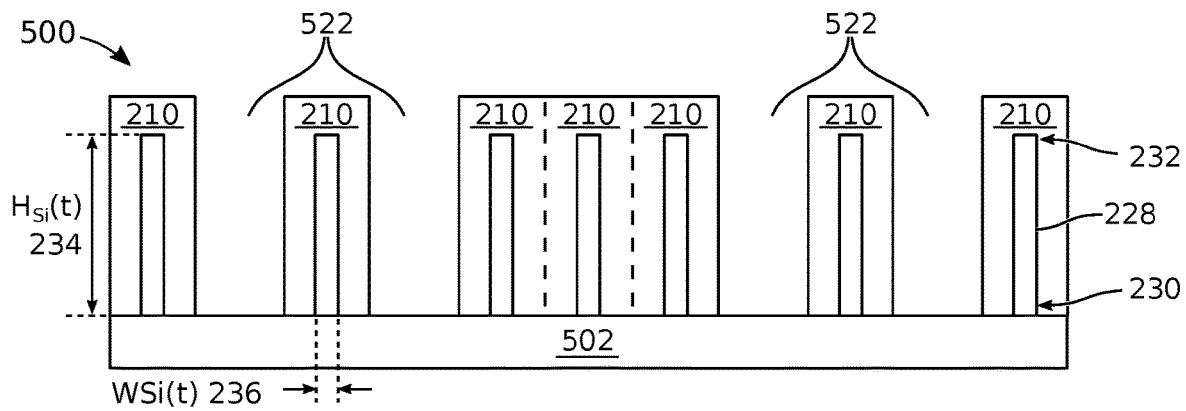

As shown in FIG. 5F, the silicon oxide features 210 may comprise an internal Si core 228 with a proximal end 230 extending from the substrate top surface 508, a distal end 232, a height ($H_{Si}(t)$) 234, a perimeter, and a width ($W_{Si}(t)$) 236, as measured in a cross-section of the perimeter at the proximal end. In one aspect, the Si cores 228 may have an aspect ratio of height to width of greater than 5:1. Although not expressly shown, the metal conductors may alternatively include wings and/or coat, without filling the trench, as shown in FIGS. 5C and 5E.

Figure 6:
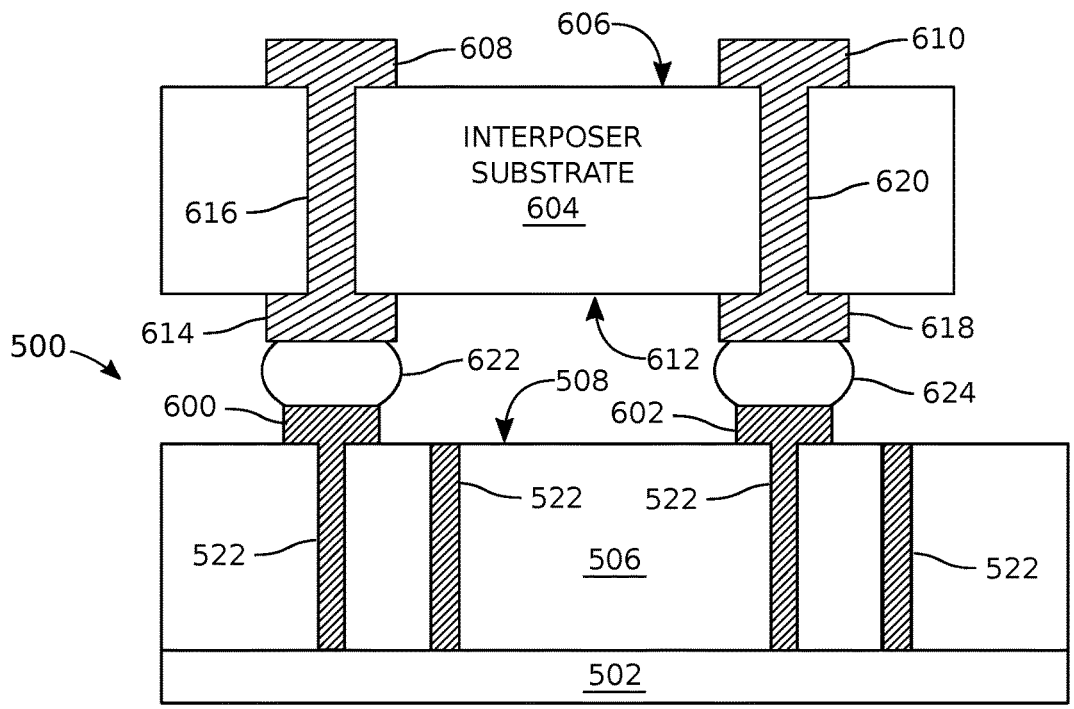
FIG. 6 is a partial cross-sectional view of the silicon oxide embedded inductor with electrical interfaces.

Accessing the inner contact of a spiral inductor without deteriorating the RF performance of the spiral inductor is always a challenging problem. One solution is an "escape structure" which is formed at either the top or bottom layer metal deposited before or after the spiral winding is processed, connecting the inner terminal of the spiral inductor to the outer world (e.g., terminal 513b in FIG. 5A). The capacitive coupling of the escape structure and the spiral windings forms a capacitor between the input and the output of the spiral inductor. Capacitive coupling of the escape structure to the inductor windings, and its resistance, deteriorates the RF performance of the spiral inductor. Therefore, the escape structure has to have a low resistance as well as low as possible capacitive coupling to the spiral windings it overlaps. To reduce the resistance, a wider metal can be used, but this increases the capacitive coupling to the overlapping windings of the spiral. The only solution is to increase the distance between the spiral layer and the escape layer. In conventional spiral processing the previous or the top metal layer distances to the winding layer cannot be changed much. As an alternative disclosed below, instead of depositing another metal layer on top, or using the metal layer below the spiral winding layer, which in either case has a limited thickness and spacing from the spiral winding layer to access the inner contact of the spiral inductor, a separate interposer is used that acts like a connection and distribution layer, interfacing both of the contacts to the outside world. Since the interposer thickness can easily be made much larger than any interlayer dielectric deposition, and can be made much thicker with a much narrower overlap, the result is an improved RF performance spiral inductor. The interposer can be silicon, glass, a printed circuit board (PCB), low temperature cofired ceramic (LTCC), ceramic, or any kind of material used as a redistribution layer material in advanced packaging. FIG. 6 is a partial cross-sectional view of the silicon oxide embedded inductor with electrical interfaces. A first electrical terminal 600 is formed on the silicon oxide layer top surface 508 at the first end (513a, see FIG. 5A) of the metal conductor 522. A second electrical terminal 602 is formed on the silicon oxide layer top surface 508 at a second end (513b) of the metal conductor 522. In one aspect, an interposer substrate 604 is attached, having a top surface 606 with a first electrically conductive terminal 608 and a second electrically conductive terminal 610. The interposer substrate 604, which may be silicon, a PCB, ceramic, or glass material for example, as mentioned above. It has a bottom surface 612 with a first electrical interface 614 connected to the interposer substrate first terminal 608 through a via 616, and a second electrical interface 618 connected to the interposer substrate second terminal 610 through a via 620. A first electrical connection 622 is formed between the first electrical interface 614 and the inductor first terminal 602, and a second electrical connection 624 is formed between the second electrical interface 618 and the inductor second terminal 604. The first and second electrical connections 622 and 624 may, for example, be a solder bump as in C4 or ball grid array (BGA) packaging technologies, although there is no particular limitation to the type of connectors that may be used. Another method of contacting the spiral inductor is from the bottom of the substrate as explained in [6-8]. As explained in [6-8], having the capability of contacting the spiral inductor from both sides gives advantages in power management applications.

Derivation of the Texturing Rule for Growing Very Thick Thermal $SiO_2$

Figure 7:
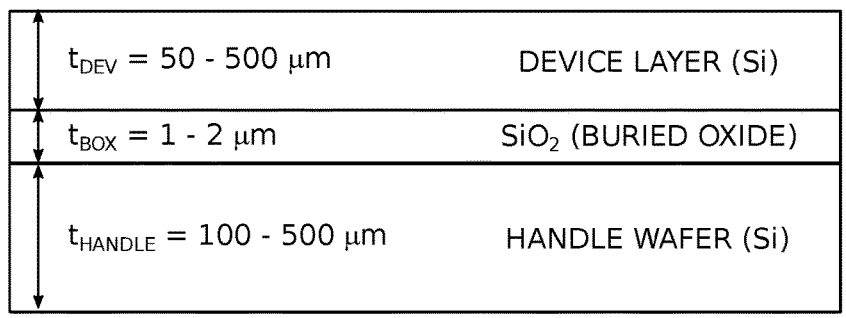
FIG. 7 is a partial cross-sectional view depicting a bonded SOI wafer structure (prior art).

FIG. 7 is a partial cross-sectional view depicting a bonded SOI wafer structure (prior art). A handle Si layer underlies the buried oxide layer. The top layer, where silicon devices are conventionally built, is commonly called the "device layer". Customized bonded SOI wafers with device layer thicknesses of 50 to 500μ, with various doping concentrations are readily available. Device layers all the way to 5-10μ thicknesses can also be custom ordered. The handle layer thickness ($t_{HANDLE}$) is in the range of 300 to 500μ, again available in various doping concentrations. Typically the buried oxide layer is thermally grown $SiO_2$, commonly called (BOX), and is 1-2μ thick ($t_{BOX}$). One goal of growing thick local oxidation regions, with no width or size restriction at the "device layer", and extending all the way to the buried oxide, is to form fully oxide isolated silicon structures, which is difficult to do using conventional processes due to the oxidation kinetics associated with device layer thicknesses of 50-500μ.

Figure 8:
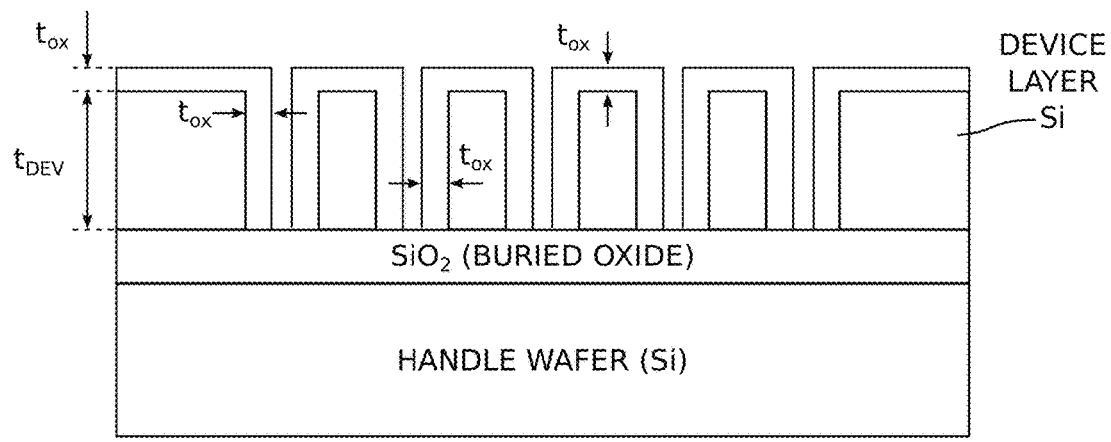
FIG. 8 is a partial cross-sectional view depicting an SOI substrate with equally spaced, equal width trenches etched into the device layer using DRIE (e.g., Bosch process), extending all the way to the buried oxide.

FIG. 8 is a partial cross-sectional view depicting an SOI substrate with equally spaced, equal width trenches etched into the device layer using DRIE (e.g., Bosch process), extending all the way to the buried oxide. The device layer top surface and the vertical trench walls are thermally oxidized. Since the silicon in the device layer is on top of the buried oxide, it can only oxidize laterally (along x and y axes) and from the top in the z axis. Using oxidation kinetics a mathematical relationship can be defined that correlates the trench width and the spacing for a given targeted oxide thickness. Using these relationships, the thermally grown oxides of adjacent silicon structures in the lateral dimensions merge and fuse together with the neighboring oxide structures. The derived mathematical relationship ensures that the silicon regions in the device layer are also completely oxidized creating a continuous, low stress very thick thermal $SiO_2$ that extends from the Si surface to the buried oxide, with no size and shape limitations.

Bosch, and the less practical cryogenic DRIE processes are able to etch very deep and very high aspect ratio trenches with perfectly vertical walls needed for these applications. In the Bosch process aspect ratios in the range of 25-50 are common, and aspect ratios of over 100 have been reported with clean vertical walls [6-11]. Currently, the primary use of the Bosch process is for Through Silicon Via (TSV) applications that stack substrates for very high-density packaging.

Figure 9:
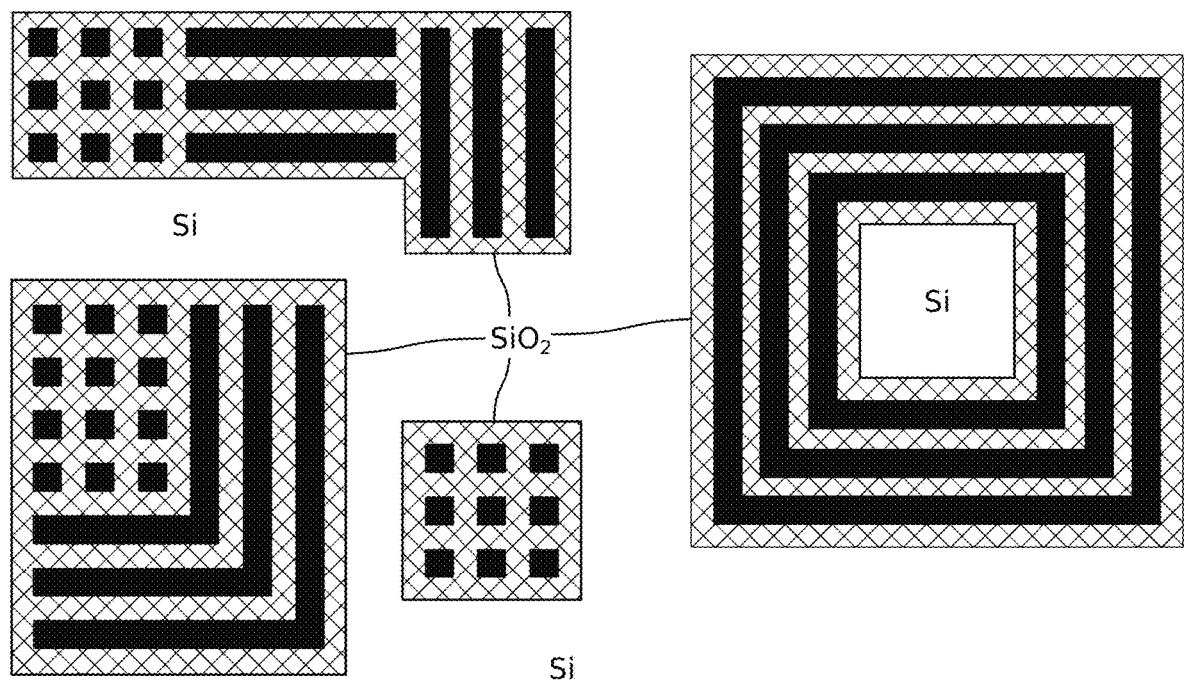
FIG. 9 is a plan view depicting exemplary Bosch etch texture patterns that obey the derived trench width and the spacing rule.

FIG. 9 is a plan view depicting exemplary Bosch etch texture patterns that obey the derived trench width and the spacing rule. The dark regions are the original silicon regions (before oxidation), the cross-hatched regions are the regions of grown oxide, and the white regions are unoxidized Si. After the Bosch etch, the textured surface is oxidized and the laterally grown oxides of the textures merge and bond together. Since the silicon texture region dimensions are set by the derived mathematical relationship, they can be completely oxidized, leaving no silicon region between the trenched geometry, creating the textured surface, as well creating any desired shape and size $SiO_2$ region, which can extend all the way down to the buried oxide. As can be seen, there are almost an infinite number of texture patterns that can be made using the width and spacing rules given in (1.8) and (1.9) that can create a continuous thick $SiO_2$ layer on top of the buried oxide layer, as thick as the device layer. Since the Bosch etch rate somewhat depends on the etch mask fill ratio, care must be taken to have a texture pattern that has a uniform fill ratio, satisfying the derived width/spacing texturing rules. Having a buried oxide underneath the device layer acts like an etch stop layer and makes the task of having all the trenches equal depth much easier.

Since the handle layer is only for handling, it is omitted from the following references figures in the interest of simplicity. The initial spacing between the silicon regions is the trench width S(0) separating the silicon features. Similarly, the initial width of the silicon region between the trenches, or the trench-to-trench spacing, is $W_{Si}(0)$. As oxidation proceeds, the spacing S(t) in between silicon regions, the width of the Si features $W_{Si}(t)$, and the height of the silicon regions $H_{Si}(t)$, change as a function time. Likewise, the width of the silicon oxide features $W_{OX}(t)$ and the height of the silicon oxide features $H_{OX}(t)$ change. As noted above, when a bare silicon surface is oxidized, about 44% of the oxide thickness is above the original silicon surface and about 56% of the oxide thickness is under the original silicon surface as shown in FIG. 1A. Very slight variations from these numbers are possible, as is explained in more detail below.

Thermal oxidation is a very conformal process, meaning that the thermally grown oxide thickness is very uniform on the top silicon surfaces and the sides of the trenches. Due to this property, assuming that the oxide growth rate is the same along x, y and z axes, the following relations can be written as a function of thermally grown oxide thickness $T_{OX}(t)$ as, $$S(t)=(S(0)-2\cdot[0.44\cdot T_{ox}(t)] \tag{1.3}$$

$$W_{Si}(t)=W(0)-2\cdot[0.56\cdot T_{ox}(t)] \tag{1.4}$$

$$H_{Si}(t)=H(0)-0.44\cdot T_{ox}(t) \tag{1.5}$$

The 0.44 and 0.56 numbers in equations (1.3) and (1.4) correspond, respectively, to the $T_{UP}$ and $T_{DOWN}$ values shown in FIG. 1A. The patterning condition which generates a full oxidation of any selected region is given by two simple formulas as the function of thermally grown oxide thickness making both S(t) and $W_{Si}(t)$ equal to zero as, $$S(0)=2\cdot[0.44\cdot T_{ox}(t)] \tag{1.6}$$

$$W_{Si}(0)=2\cdot[0.56\cdot T_{ox}(t)] \tag{1.7}$$

Here, S(0) and $W_{Si}(0)$ are the initial trench width and trench spacing, respectively. Simplifying (1.6) and (1.7) gives, $$S(0)=0.88\cdot T_{ox}(t) \tag{1.8}$$

$$W_{Si}(0)=1.12\cdot T_{ox}(t) \tag{1.9}$$

Writing $T_{OX}$ in terms of S(0) and $W_{Si}(0)$ gives, $$T_{ox} = \frac{s_0}{0.88} = 1.1363 \cdot S(0) \tag{1.10}$$

Or, $$T_{ox} = \frac{W_{Si}(0)}{1.12} = 0.8929 \cdot W_{Si}(0) \tag{1.11}$$

Combining (1.9) and (1.10) gives the trench spacing $W_{Si}(0)$ in terms of trench width $S(0)$ as, $$W_{Si}(0) = 1.12 \cdot 1.1363 \cdot S(0) \quad (1.12)$$
$$= 1.2728 \cdot S(0)$$

Or combining (1.8) with (1.11) or directly from (1.12) gives, $$S(0) = 0.88 \cdot 0.8929 \cdot W_{Si}(0) \quad (1.13)$$
$$= 0.7858 \cdot W_{Si}(0)$$

As can be seen, to have continuous $SiO_2$ in the local oxide region as shown in FIG. 4D for example, $W_{Si}(0)$, which is the width of silicon between the trenches (trench spacing) must be greater than the spacings $S(0)$ (trench width) with the ratio given by (1.12). For this condition the oxidation process can be considered "self-stopping" because lateral oxides fill the trenches, and at the same time there is no silicon left to oxidize between the trenches. Therefore, if the silicon wafer is left longer in the oxidation furnace, no more lateral oxide forms and no harm occurs to the wafers in accomplishing the desired result. This is very powerful process control feature accomplished only by lithography, not requiring tight oxidation time control. Oxidizing the wafers longer than the necessary oxidation times only degrades the planarity of the overall structure a very small amount. Since the target oxide thickness is in the order of 1-2 microns, and all of the textured silicon is oxidized in the textured regions, the only oxide growth possible is in the untextured areas (e.g., shown as 220 in FIGS. 4B-4G). Since these untextured regions already have already have 1-2 microns of oxides grown on top, even having much longer than needed oxidation times, due perhaps to large out of control process problems, does not degrade the planarity of the overall structure. As a result, planarity of the overall structure is excellent and doesn't require tight process controls.

If the trenches are separated larger than, $$W_{Si}(0) > 1.2728 \cdot S(0) \quad (1.14)$$

the $SiO_2$ in the local oxide region has isolated silicon core regions as shown in FIG. 4F.

If the trenches are closer spaced than (1.12) as, $$W_{Si}(0) < 1.2728 \cdot S(0) \quad (1.15)$$

then the silicon features are completely oxidized are there no empty regions, gaps or cavities, between the $SiO_2$ structures. However, there will be unoxidized Si cores, as shown in FIG. 4E.

Calculating $SiO_2$ Thickness Using Deep Reactive Ion Etching (DRIE)

Relations (1.8) and (1.9) give the trench width $S(0)$ and trench to trench spacing $W_{Si}(0)$ required for a given thermally grown $SiO_2$ thickness $T_{OX}$—generating a thick and continuous local oxide as shown in FIG. 4D. If trenches are etched with vertical walls and with spaces and widths satisfying the derived relations (1.8) and (1.9), there is no limit to the thicknesses of local oxide that can be formed. Thus, the thickness of $SiO_2$ is basically only limited by the trenching capability. Prior to 1994, the ability to etch trenches in silicon was limited—the walls were not vertical and aspect ratio as well as the spacing between trenches was very limited. After 1994 with the invention of the Bosch process, also known as a DRIE [9] process, even 500μ deep trenches, with vertical walls having high aspect ratios (depth/width) of 25-100 became possible [9-11]. The Bosch process became the workhorse and the only choice of TSV technology. An etch process can be defined by two aspect ratios, a and $\alpha_{SPACE}$. Using the convention for HARMS [6,7] and Modified HARMS process [8] aspect rations, and as shown in FIG. 9, they are defined as, $$\alpha = \frac{H_{Si}(0)}{W_{Si}(0)} \quad (1.16)$$

$$\alpha_{SPACE} = \frac{H_{Si}(0)}{S(0)} \quad (1.17)$$

Using (1.15) and (1.16), the starting material silicon thickness or device layer thickness for bonded SOI wafer $H_{Si}(0)$, which for the devices described herein is completely oxidized in accordance with the Bosch etch rules defined in (1.8) and (1.9) and followed by the "self-stopping oxidation", is calculated as, $$H_{Si}(0) = \min\{\alpha \cdot W_{Si}(0), \alpha_{SPACE} \cdot S(0)\} \quad (1.18)$$

The $W_{Si}(0)$ and $S(0)$ are related to each other and are only functions of the oxide thickness $T_{OX}$ as given in relations (1.8) and (1.9). As explained in HARMS [6,7] and the Modified HARMS process [8] using DRIE (e.g., the Bosch process) to form very large aspect ratios, it is possible to achieve very thick oxides by growing relatively thin thermal oxides not thicker than 1-2μ. In other words, the large trench aspect ratio enabled by the Bosch process becomes a "multiplying factor" of the thermally grown $SiO_2$ thickness $T_{OX}$.

Table 4 shows some exemplary starting material silicon thicknesses $H_{Si}(0)$, with parameters $S(0)$ and $W_{Si}(0)$ for 1 and 2μ thermally grown oxide thicknesses, with $\alpha = \alpha_{SPACE} = 5$, 25, and 50. The aspect ratio $\alpha=5$ in Table 4 is likely the optimal standard etch process (DRE) capability prior to 1994, before the Bosch process (DRIE) [9-11]. As can be seen, even with conservative aspect ratio values of 50, $SiO_2$ thicknesses on the order of 88μ can be obtained by growing only 2μ of thermal $SiO_2$, which is very straightforward in any silicon process technology. Using an aspect ratio of 100 as published in [10, 11], the achievable $SiO_2$ thickness becomes 176μ.

Some applications might require thicker oxides than 100μ. It is possible to even grow thicker thermal $SiO_2$ with a two-stage process including the initial oxidation process described above, followed by a polysilicon deposition and subsequent oxidation. As an example, the deposition of a 1μ thickness of polysilicon becomes 1.7857μ (1/0.56) of $SiO_2$ after oxidized. This process can be repeated many times and even extremely thick (e.g., 500-600μ) $SiO_2$ can be grown in a reasonable amount of time.

TABLE 4

| $T_{OX}$ (μ) | $S(0)$ (μ) | $W_{Si}(0)$ (μ) | α | $H_{Si}(0)$ (μ) |
|---|---|---|---|---|
| 1 | 1.12 | 0.88 | 5 (DRE) | 4.4 |
| 1 | 1.12 | 0.88 | 25 (DRIE) | 22 |
| 1 | 1.12 | 0.88 | 50 (DRIE) | 44 |
| 2 | 2.24 | 1.76 | 5 (DRE) | 8.8 |
| 2 | 2.24 | 1.76 | 25 (DRIE) | 44 |
| 2 | 2.24 | 1.76 | 50 (DRIE) | 88 |

Exemplary Application of the Thick Oxide Process for Making High Performance Planar Miniature Spiral Inductors One immediate application of the thick $SiO_2$ process is in the creation of spiral inductors completely embedded in a very planar $SiO_2$ layer. High aspect ratio and spacing (HARMS) miniature spiral structures [6,7], due to their high aspect ratio metals windings and spacings in between, provide a higher performance inductors as compared to conventional components built with glass counterparts [12-18].

Figure 10A:
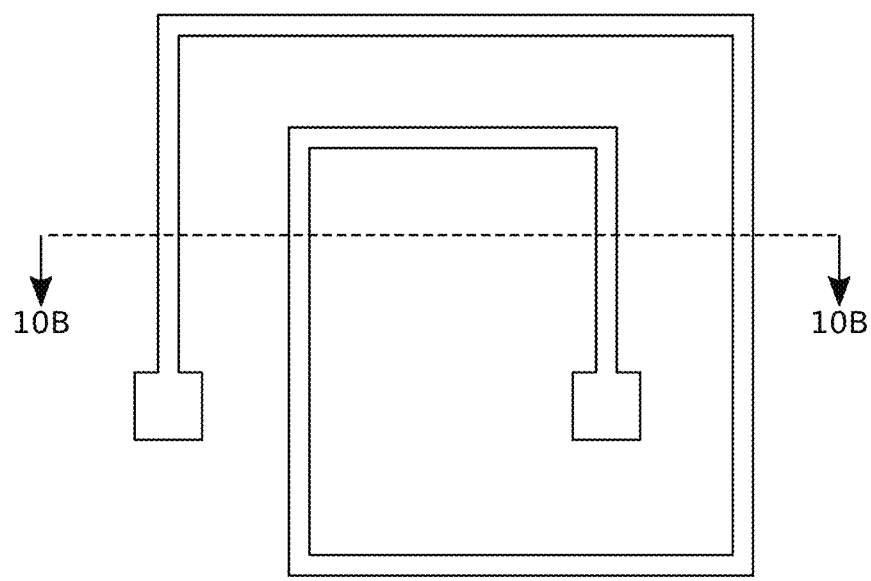
FIGS. 10A and 10B are, respectively, plan and partial cross-sectional views of a non-planar high aspect ratio inductor using HARMS and modified HARMS processes.
Figure 10B:
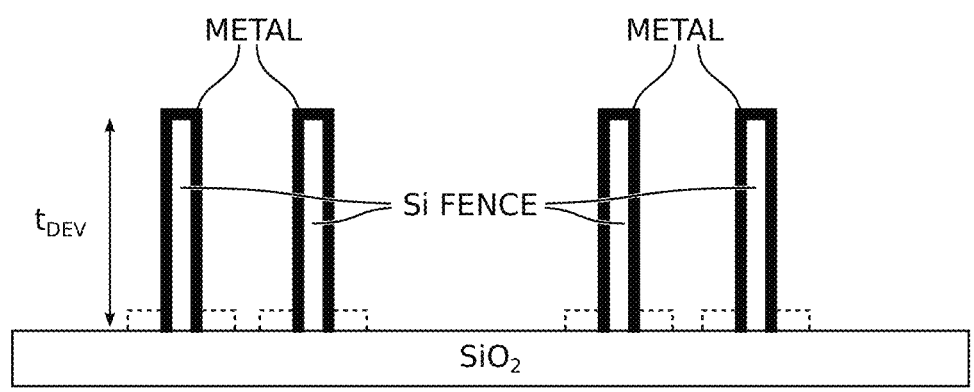

FIGS. 10A and 10B are, respectively, plan and partial cross-sectional views of a non-planar high aspect ratio inductor using HARMS and modified HARMS processes. 50-300μ thick layers of metal cannot be etched vertically to form high aspect ratio metal components. However, high aspect ratio Si structures can be etched using the Bosch process leaving only the spiral winding areas, which may be referred to as a silicon core or silicon fence, and subsequently oxidized. After oxidation and an ALD step (Atomic Layer Deposition) of a suitable seed metal, electroplating metallization is performed, on the order of 4 skin depths 5. Alternatively, as shown in phantom, the electroplated metal may be etched to leave metal footers in the bottom of the metal windings, sitting on the buried oxide.

Columns 2 and 5 in Table 5 give the skin depth for some important frequencies in the radio frequency (RF) spectrum using copper and aluminum metallization [6, 7]. For RF applications, the width of the spiral windings does not need to be wider than approximately 4 times the skin depth 6 [19-21] as shown in columns 4 and 7 in Table 5 for Al and Cu metallization, respectively. Making the windings wider than 4 times the skin depth for an RF application reduces only the DC resistance, without a significant reduction in the AC resistance of the spiral inductors [6-8], However, a lower DC resistance is also an important parameter in power management applications.

The spiral winding rule (i.e., four times the skin depth given for all important RF frequencies as given in Table 5) determines the minimum fence-to-fence spacing and electroplating metal thickness, which is a function of the starting silicon thickness and the spacing aspect ratio $\alpha_{SPACE}$. Calculations show that these structures give easily realizable spiral inductors with high aspect ratio metal windings.

Returning briefly to FIGS. 5A-5D for example, spiral inductors completely embedded in a very low loss dielectric like $SiO_2$, along with high aspect ratio metal windings, as originally given in HARMS process, give a very significant advantage in high frequency performance, as compared to spiral inductors made in glass, as referenced in [12-18]. As can be seen, the HARMS and modified HARMS process spiral inductors result in a non-planar geometry, which can be a drawback in later assembly steps. In contrast, a highly planar spiral inductor completely embedded in $SiO_2$ is superior in reliability, mechanical handling, and packaging yields.

FIGS. 11A and 11B are, respectively, plan and partial cross-sectional views of exemplary texture (Si etch) patterns possible for creating a silicon oxide embedded inductor. Also shown, but not to scale, Si feature 1100 may comprise a continuous series of scallops 1102 formed along the vertical surfaces, as would occur as the result of Bosch process etching. Although only one Si feature is shown with scallops for simplicity, in one aspect all the Si features would have the scallops, again, as might be the result of the Bosch process.

Figure 12A:
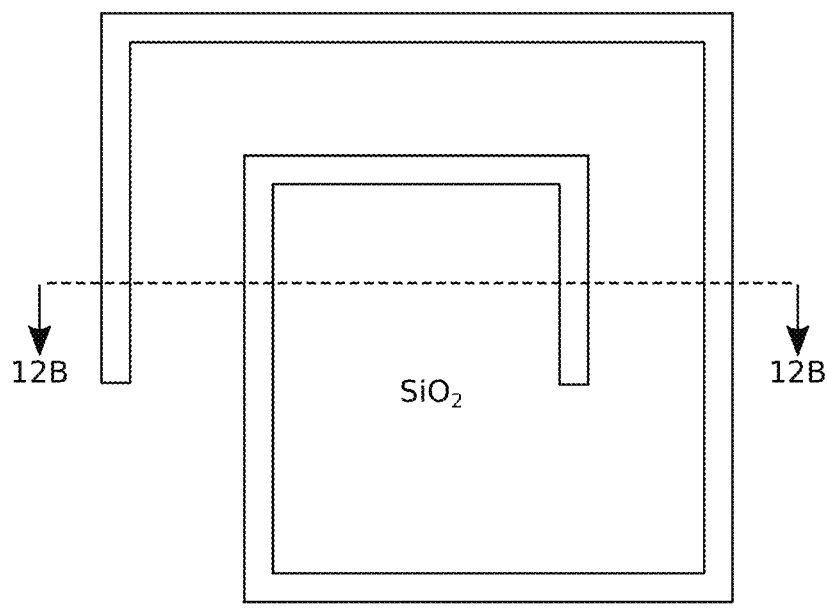
Figure 12B:
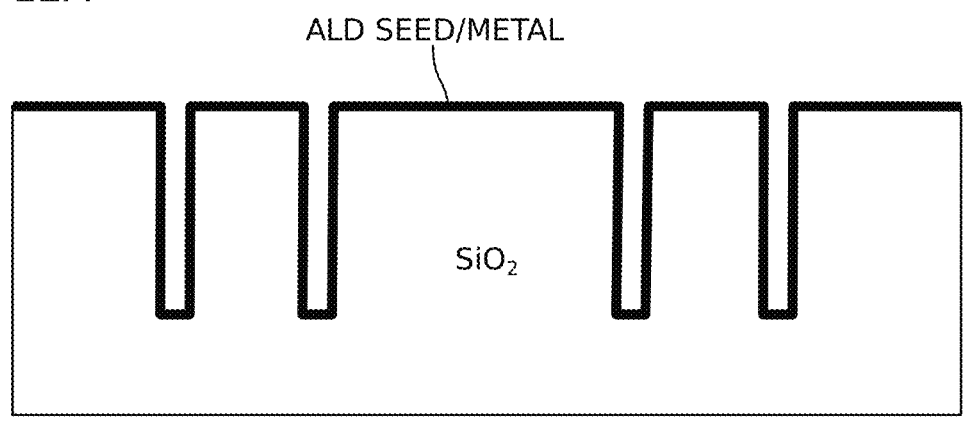
Figure 12C:
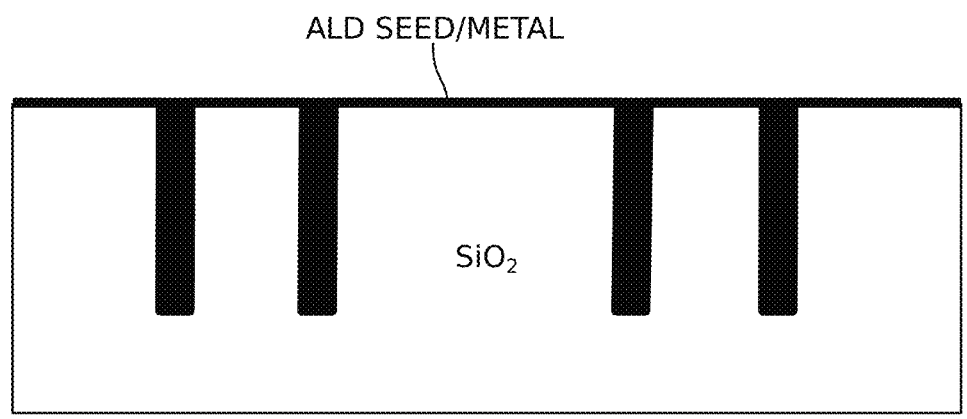
Figure 12E:
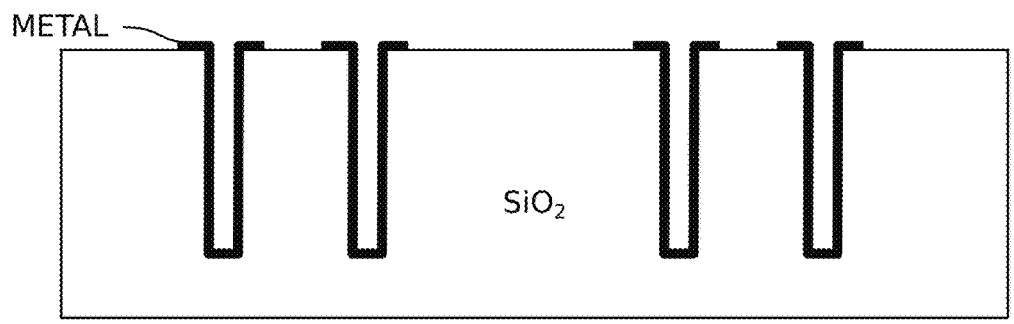
Figure 12F:
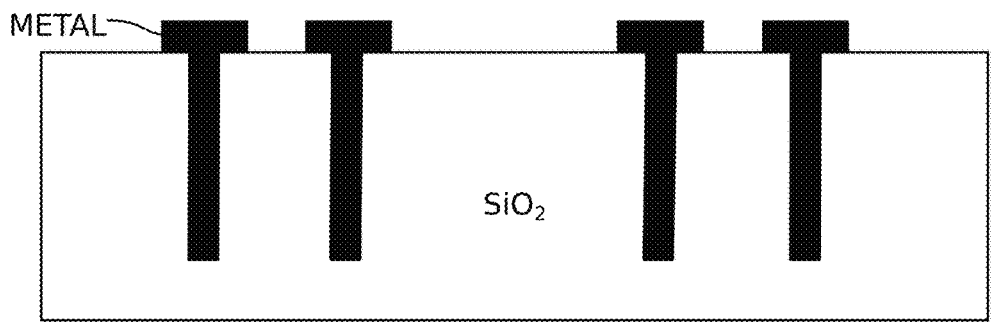

FIGS. 12A through 12F depict steps in the fabrication a silicon oxide embedded inductor using the texture patterns of FIGS. 11A and 11B. FIG. 12A is a plan view depicting the formation of silicon oxide layers following the oxidation of the etched Si depicted in FIG. 11A. A spiral trench is formed between the thick silicon oxide regions as a result of wider etched Si trenches (see formula 1.13). FIG. 12B is a partial cross-sectional view depicting the structure of FIG. 12A following ALD seed metal deposition and metal electroplating steps. FIG. 12C depicts the structure of FIG. 12A following alternative ALD/metal electroplating deposition to the desired metal thickness. FIG. 12D depicts the structure of FIG. 12B following the step of metal etching. Optional metal wings are shown. FIG. 12E depicts the structure of FIG. 12C following the step of metal etching. Optional metal wings are shown.

Spiral pads can be bumped from the top, bottom, or from both sides as explained in the HARMS process [6-8]. The spiral metal in that case is a full metal, without a silicon core or fence as explained and derived in the HARMS process [6-8].

TABLE 5

| f [MHz] | δ(Al) [μ] | δ(Al) × 1.6 [μ] $R_{AC}/R_{DC} = 2$ "Single Sided" Solution | δ(Al) × 3.85 [μ] $R_{AC}/R_{DC} = 2$ "Complete" Solution | δ(Cu) [μ] | δ(Cu) × 1.6 [μ] $R_{AC}/R_{DC} = 2$ "Single Sided" Solution | δ(Cu) × 3.85 [μ] $R_{AC}/R_{DC} = 2$ "Complete" Solution |
|---|---|---|---|---|---|---|
| 25 | 16.63 | 26.608 | 64.025 | 13.22 | 21.152 | 50.897 |
| 50 | 11.76 | 18.816 | 45.276 | 9.348 | 14.957 | 35.989 |
| 100 | 8.316 | 13.306 | 32.017 | 6.610 | 10.576 | 25.449 |
| 200 | 5.880 | 9.408 | 22.638 | 4.674 | 7.479 | 17.995 |
| 900 | 2.772 | 4.435 | 10.672 | 2.203 | 3.525 | 8.483 |
| 1,200 | 2.401 | 3.841 | 9.242 | 1.908 | 3.053 | 7.347 |
| 1,575 | 2.095 | 3.353 | 8.067 | 1.666 | 2.665 | 6.414 |
| 2,400 | 1.697 | 2.716 | 6.533 | 1.349 | 2.159 | 5.195 |
| 5,200 | 1.153 | 1.845 | 4.439 | 0.916 | 1.467 | 3.529 |

The resulting spiral cross-section gives the desired high aspect ratio metal winding geometry, which is electromagnetically superior to any prior art spiral inductors, but it does not yield a planar structure. This non-planarity leaves the spiral sections susceptible to damage, making the inductor difficult to protectively package.

Kinetics of the Thermal Oxidation of Silicon

Since the fabrication of the above-described devices relies on the properties of silicon oxidation of silicon, a brief introduction to the kinetics of this very important step in silicon processing, formulated by Deal and Grove in 1965 [3-5, 24], is presented below. The goal here is to give more emphasis to the mathematical details of the oxidation kinetics, which most publications merely summarize, making it difficult to follow the very elegant mathematical thought process.

Oxidation kinetics is a complex phenomenon. Since the structures described herein rely upon the oxidation of a silicon fin, column, or more generally a complex three-dimensional structure, a three-dimensional analysis is required, which can be done only numerically, with limited success even today. Therefore, the analysis given here is only for one dimension.

Thermally grown $SiO_2$ is amorphous with $2.2 \times 10^{22}$ molecules per $cm^{-3}$, having a mass density of 2.3 grams (gr) per $cm^{-3}$. The crystalline form of $SiO_2$, known as quartz, has a mass density of 2.65 $gr/cm^{-3}$. Since oxidation is a high temperature process, the melting temperature of silicon and $SiO_2$ puts an upper temperature limit on the process, which is 1,415° C. for silicon and approximately 1,600° C. for $SiO_2$. However, temperature also determines the mechanical integrity of the wafers, such as their flatness and their handling capabilities at high temperatures, which puts the practical limit on the maximum oxidation temperature at 1,250° C.

Figure 15:
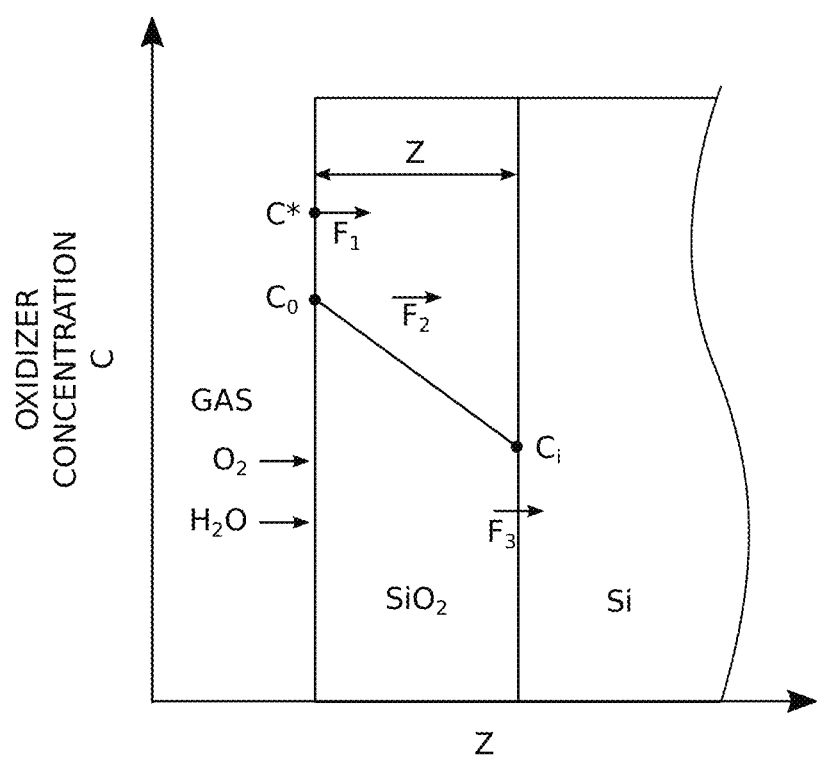
FIG. 15 is a diagram describing the flux conditions for a Si—SiO$_2$ system, which is the Deal-Grove model (prior art).

FIG. 15 is a diagram describing the flux conditions for a Si—$SiO_2$ system, which is the Deal-Grove model (prior art). The oxidation of silicon is a chemical process with a reaction rate dependent upon the density of the silicon and oxygen molecules at the Si—$SiO_2$ interface. Since the oxygen molecules must diffuse through the already existing or prior grown $SiO_2$ layer, their density at the Si—$SiO_2$ interface is a function of the thickness of the $SiO_2$, the temperature, and the pressure. Since the oxygen molecule transport is a diffusion process, it is characterized by the well-known diffusion equation, $$\nabla(D\nabla C) = \frac{\partial C}{\partial t} \qquad (2.1)$$

where, D and C are the diffusion coefficient of oxygen in $SiO_2$ and oxygen concentration. Assuming uniform diffusion coefficient for oxygen D in the $SiO_2$ equation (2.1) in one dimension can be written simpler as, $$D\frac{\partial^2 C}{\partial z^2} = \frac{\partial C}{\partial t} \qquad (2.2)$$

To solve the diffusion equation (2.1) or (2.2) boundary conditions must be defined, one of which is the oxygen concentration at the surface of the $SiO_2$ as in gas form. Oxygen concentration, being in the gaseous form in the oxidation furnace, is known by the ideal gas law defined by the relation, $$P \cdot V = n \cdot R \cdot T = N \cdot k \cdot T \qquad (2.3)$$

where P, V, n, R, N, k and T are, respectively: pressure, volume number of mols, universal gas constant, number of gas molecules, Boltzmann constant, and absolute temperature. Relation (2.3) shows that if the pressure of the oxidizing gas is increased, the oxidation time can be reduced for a desired oxide thickness, and this is the basis of hi-pressure oxidation (HIPOX) that is performed on the order of 25 atmosphere steam pressures. If there is another gas, like steam in the oxidation furnace, the application of Henry's law permits the calculation of the concentration of each species from their partial pressures and the maximum possible oxidant concentration at the surface $C^*$ is given by, $$C^* = H \cdot P \qquad (2.4)$$

where H is the Henry's law coefficient. The oxidant concentration in this non-equilibrium case is less than $C^*$ on the solid surface as shown in FIG. 15. The flux $F_1$ is given by the difference, $$F_1 = h \cdot (C^* - C_0) \qquad (2.5)$$

where, $C_0$ is the oxidant surface concentration and h the main transfer coefficient, all functions of temperature, gas flow rate, and solid solubility of oxidants in the oxide.

From the Fick's law, the flux across the $SiO_2$ having a thickness of z is given by, $$F_2 = -D\frac{dC}{dz} = D\frac{(C_0 - C_i)}{z} \qquad (2.6)$$

where $C_i$ is the oxidant concentration in $mol/cm^3$. The flux $F_3$ at the Si—$SiO_2$ interface is determined by the reaction rate constant K and is, $$F_3 = K \cdot C_i \qquad (2.7)$$

To address the many constants the steady state [time derivative equal to zero in (2.1)] condition is introduced, $$F = F_1 = F_2 = F_3 \qquad (2.8)$$

which must be satisfied, and (2.8) allows the flux F to be calculated as a function of the $C^*$ with simply a substitution process.

Equating (2.6) and (2.7) gives, $$D\frac{(C_0 - C_i)}{z} = K \cdot C_i \qquad (2.9)$$

Solving $C_0$ from (2.9) gives, $$C_0 = C_i \left(1 + \frac{Kz}{D}\right) \qquad (2.10)$$

Substituting $C_0$ in (2.5) and equating to (2.9) gives, $$h \cdot \left[C^* - C_i\left(1 + \frac{Kz}{D}\right)\right] = K \cdot C_i \qquad (2.11)$$

Solving $C_i$ from (2.11) gives, $$C_i = \frac{C^*}{1 + \frac{K}{h} + \frac{Kz}{D}} \qquad (2.12)$$

Using (2.10) and (2.12), $C_0$, $C_i$ and the fluxes as a function of $C^*$ can be calculated. The rate of oxide growth at the Si—$SiO_2$ interface can be written in the form of, $$N_i \frac{dz}{dt} = F_3 = K \cdot C_i = K \frac{C^*}{1 + \frac{K}{h} + \frac{Kz}{D}} \qquad (2.13)$$

$N_i$ is the molecules needed to form a unit volume of $SiO_2$. Since there are $2.2 \times 10^{22}$ of $SiO_2$ molecules in 1 cm³ of $SiO_2$, $2.2 \times 10^{22}$ of $O_2$ or $4.4 \times 10^{22}$ $H_2O$ molecules are needed according to chemical reactions given as (1.1 and 1.2).

Writing (2.11) as, $$N_i \left(1 + \frac{K}{h} + \frac{Kz}{D}\right) dz = KC^* dt \qquad (2.14)$$

Integrating both sides of (2.14) gives, $$N_i \int \left(1 + \frac{K}{h} + \frac{Kz}{D}\right) dz = KC^* \int dt \qquad (2.15)$$

Integration gives, $$N_i \left(1 + \frac{K}{h}\right) z + \frac{K}{2D} z^2 = KC^* t + U \qquad (2.16)$$

where U is the arbitrary integration constant. As can be seen, (2.16) is a second order equation in terms of z and U, and can be calculated by the initial oxide thickness $Z_i$ at t=0 as, $$U = N_i \left(1 + \frac{K}{h}\right) z_i + \frac{K}{2D} z_i^2 \qquad (2.17)$$

Substituting U in (2.17) to (2.16) gives, $$z^2 + Az = B(t + \tau) \qquad (2.18)$$

where, $$A \equiv 2D\left(\frac{1}{K} + \frac{1}{h}\right) \cong \frac{2D}{K} \text{ for } h \gg K \qquad (2.19)$$

$$B \equiv \frac{2DC^*}{N_i} \qquad (2.20)$$

$$\tau \equiv \frac{z_i^2 + Az_i}{B} \qquad (2.21)$$

Solving the quadratic equation (2.18) gives oxide thickness as a function of time along with experimentally measurable oxidation condition dependent constants A, B, and τ as, $$Z = \frac{A}{2}\left[\left(1 + \frac{t + \tau}{\frac{A^2}{4B}}\right)^{\frac{1}{2}} - 1\right] \qquad (2.22)$$

The relation (2.22) has two limiting cases as, $$t + \tau \ll \frac{A^2}{4B} \to Z \cong \frac{B}{A}(t + \tau) \cong \frac{KC^*}{N_i}(t + \tau) \qquad (2.23)$$

B/A in equation (2.23) is called the "linear" rate and B is called the "parabolic" rate constants. For, $$\tau \gg \frac{A^2}{4B} \to Z \cong \sqrt{B(t + \tau)} \qquad (2.24)$$

As can be seen, for long oxidation times or after a thick oxide is formed, the thermal oxide thickness becomes proportional to the square root of the oxidation time, giving the need for this process mathematically. The oxidation parameters in open form as a function of temperature can be given as, $$B \equiv \frac{2DC^*}{N_i} = C_1 e^{-\frac{E_1}{kT}} \qquad (2.25)$$

$$\frac{B}{A} = C_2 e^{-\frac{E_2}{kT}} = \frac{C^*}{N_i\left(\frac{1}{K} + \frac{1}{h}\right)} \qquad (2.26)$$

Table 6 shows the parameters for dry and wet oxidation.

TABLE 6

|  | DRY OXIDATION | WET OXIDATION |
| --- | --- | --- |
| $N_i$ | $2.2 \times 10^{22}$ cm⁻³ | $4.4 \times 10^{22}$ cm⁻³ |
| $C_1$ | $7.72 \times 10^2$ μ² · hour⁻¹ | $2.24 \times 10^2$ μ² · hour⁻¹ |
| $C_2$ | $6.23 \times 10^6$ μ · hour⁻¹ | $8.95 \times 10^7$ μ · hour⁻¹ |
| $E_1$ | 1.23 eV · molecule⁻¹ | 0.71 eV · molecule⁻¹ |
| $E_2$ | 2.0 eV · molecule⁻¹ | 1.97 eV · molecule⁻¹ |
| $z_i$ | 0 Angstrom | 200 Angstrom |

Volumetric Change in the Formation of $SiO_2$ Employed in Geometrical Rules

Another important issue is the calculation of the volumetric change when silicon is oxidized to form $SiO_2$. This information is used in the formulations of the geometrical rules needed to derive of the above-described structures. First, the molecular density of Si and $SiO_2$ is required. As given before, there are $2.2 \times 10^{22}$ of $SiO_2$ molecules in 1 cm³. On the other hand, there are $5 \times 10^{22}$ of Si atoms in 1 cm³. Therefore, the unconstrained volumetric increase in the $SiO_2$ formation can be formulated by the ratios of silicon atom density to the molecular density of $SiO_2$ and given as, $$\frac{N_{Si}}{N_{ox}} = \frac{5 \times 10^{22}}{2.2 \times 10^{22}} = 2.2727 \qquad (3.1)$$

In plain English, if a cube of silicon with sides of a=1 cm and a volume of 1 cm³ is oxidized, it occupies 2.2727 cm³. The sides of the cube are related to the cube root of 2.2727 as, $$\left(\frac{N_{Si}}{N_{ox}}\right)^{\frac{1}{3}} = 1.3148 \qquad (3.2)$$

In LOCOS, the silicon surrounding the oxidation volume confines the volumetric expansion to one dimension and it is named "planar oxidation", which also creates stress.

The inverse of (3.2) gives the value 0.44, and this value is used as the multiplier in the geometrical rule derivation as shown in FIG. 1A.

$$\frac{N_{ox}}{N_{Si}} = \frac{2.2 \times 10^{22}}{5 \times 10^{22}} = 0.44 \quad (3.3)$$

To summarize, the planar oxidation height increases, and its components for a growth of $SiO_2$ having a thickness of $T_{OX}$ "approximately" gives $T_{UP}$, which is the region expands over the original silicon surface, as, $$T_{up} = \frac{N_{ox}}{N_{Si}} \cdot T_{ox} = 0.44 \cdot T_{ox} \quad (3.4)$$

The silicon consumed for growing $SiO_2$ having a thickness of $T_{OX}$, or in other words the $SiO_2$ thickness going below the original silicon surface $T_{DOWN}$ "approximately" can be calculated as, $$T_{down} = 1 - \frac{N_{ox}}{N_{Si}} \cdot T_{ox} \quad (3.5)$$
$$= 1 - 0.44 \cdot T_{ox}$$
$$= 0.56 \cdot T_{ox}$$

It is important to note that the oxide growth rate and formulations given in the volumetric changes presented above are also weakly related to crystal orientation, doping concentration in silicon, and its surface preparation, and that is why the statement "approximately" is used in (3.4) and (3.5) derivations. The geometry of the Si structures can also affect the rate at which they are oxidized. As an example, <111> orientation silicon oxidizes faster than <100> orientation silicon and this difference is smaller at higher oxidation temperatures. Oxidation is also faster for higher p or n doping concentrations and is related to how the impurities are redistributed. Oxidation in $O_2$ and HCl greatly improves threshold voltage stability in MOS devices and increases the dielectric strength and oxidation rate.

In general, the values 0.44 and (1-0.44)=0.56 for $T_{UP}$ and $T_{DOWN}$, respectively, are standard ratios that are accepted throughout the industry and literature, as used in the formulations (1.3)-(1.17). Their variation depending on the oxidation conditions is small. Variations for $T_{UP}$ and $T_{DOWN}$ in the ranges of $0.42 < T_{UP} < 0.46$ and $0.58 < T_{DOWN} < 0.54$ are reasonable in any oxidation condition.

The variability in $T_{UP}$ and $T_{DOWN}$ in the relations derived earlier in (1.3)-(1.13) for their fixed values of 0.44 and 0.56 can be taken into consideration by writing them in the following parameterized relations in terms of $T_{UP}$ and $T_{DOWN}$ as, $$S(t) = S(0) - 2 \cdot [T_{UP} \cdot T_{ox}(t)] \quad (3.6)$$

$$W_{Si}(t) = W(0) - 2 \cdot [T_{DOWN} \cdot T_{ox}(t)] \quad (3.7)$$

$$H_{Si}(t) = H(0) - T_{UP} \cdot T_{ox}(t) \quad (3.8)$$

$$S(0) = 2 \cdot [T_{UP} \cdot T_{ox}(t)] \quad (3.9)$$

$$W_{Si}(0) = 2 \cdot [T_{DOWN} \cdot T_{ox}(t)] \quad (3.10)$$

Here, $S(0)$ and $W_{Si}(0)$ are the initial trench width and trench spacing, respectively. Simplifying (3.9) and (3.10) gives, $$S(0) = 2 \cdot T_{UP} \cdot T_{ox}(t) \quad (3.11)$$

$$W_{Si}(0) = 2 \cdot T_{DOWN} \cdot T_{ox}(t) \quad (3.12)$$

Writing $T_{OX}$ in terms of $S(0)$ and $W_{Si}(0)$ gives, $$T_{ox} = \frac{S(0)}{2 \cdot T_{UP}} \quad (3.13)$$

Or, $$T_{ox} = \frac{W_{Si}(0)}{2 \cdot T_{DOWN}} \quad (3.14)$$

Combining (3.12) and (3.13) gives the trench spacing $W_{Si}(0)$ in terms of trench width $S(0)$ as, $$W_{Si}(0) = \frac{2 \cdot T_{DOWN}}{2 \cdot T_{UP}} S(0) \quad (3.15)$$
$$= \frac{T_{DOWN}}{T_{UP}} \cdot S(0)$$

Or combining (3.11) with (3.14) or directly from (3.15) gives, $$S(0) = \frac{T_{UP}}{T_{DOWN}} W_{Si}(0) \quad (3.16)$$

Figure 13:
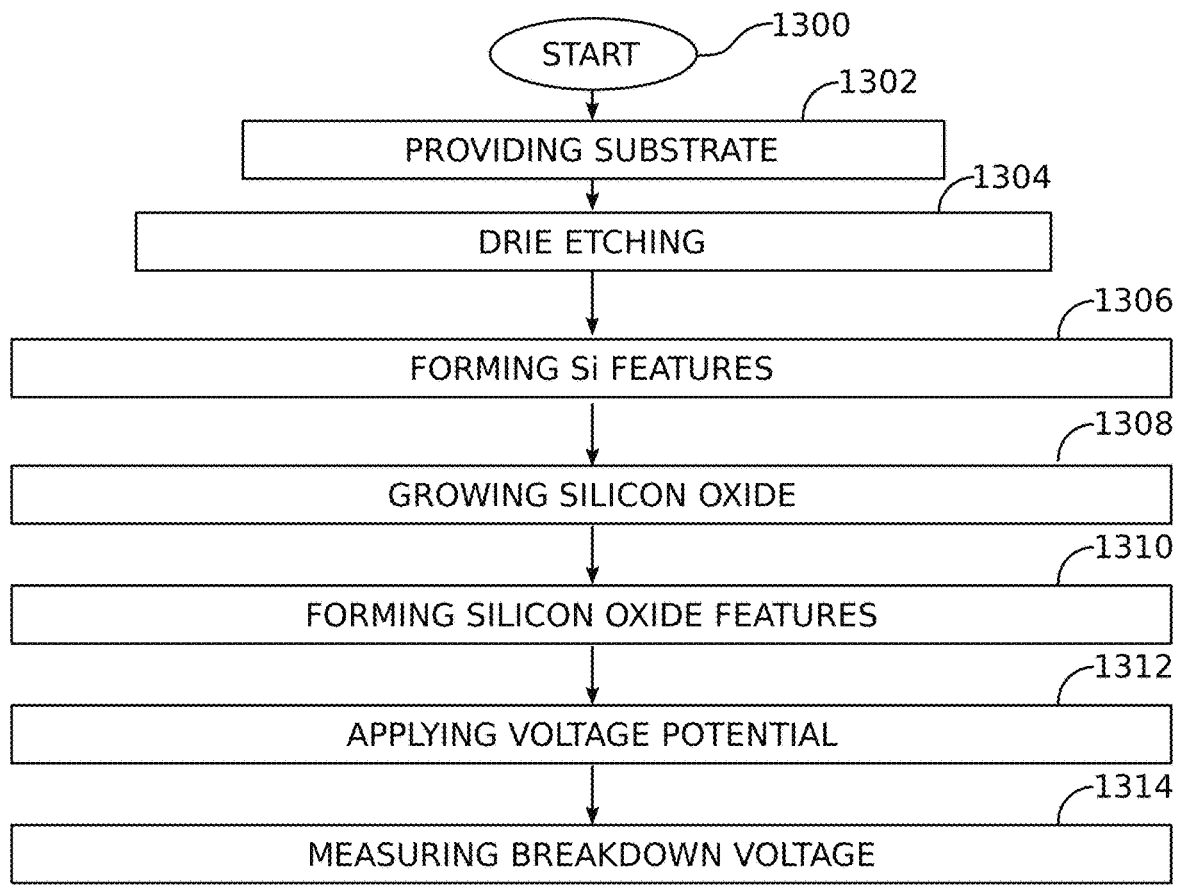
FIG. 13 is a flowchart illustrating a method for fabricating a silicon oxide structure.

FIG. 13 is a flowchart illustrating a method for fabricating a silicon oxide structure. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1300.

Step 1302 provides a substrate having a top surface, with an overlying Si layer having a top surface. Using a DREI process, Step 1304 etches an unmasked region of the Si layer. In response to the DREI process, Step 1306 forms a Si feature with a proximal end extending from the substrate top surface, a distal end, a height ($H_{Si}(0)$), a perimeter, a width ($W_{Si}(0)$), as measured in a cross-section of the perimeter at the proximal end. In one aspect, the Si feature has an aspect ratio of height to width of greater than 5:1. The difference of width between the proximal and distal ends is typically less than 10%. As noted above, the Si feature may have a perimeter in the shape of a circle, a square, a rectangle, a polygon, a ridge, or a shaped ridge. Step 1308 grows a silicon oxide ($SiO_2$) film overlying the Si feature having a thickness ($T_{OX}(t)$). Step 1310 forms a silicon oxide feature with a proximal end extending from the substrate top surface, a distal end, a height, a perimeter, and a width, as measured in a cross-section of the perimeter at the proximal end. The difference of width between the proximal and distal ends is typically less than 10%. In one aspect, the Si oxide feature has an aspect ratio of height ($H_{OX}(t)$) to width ($W_{OX}(t)$) of greater than 5:1. As noted above, silicon oxide features heights of greater than 5 microns are easily obtainable.

In one aspect, forming the silicon oxide feature in Step 1310 includes forming a Si oxide feature comprising:

a height $H_{OX}(t) = H_{Si}(0) + \text{about } 0.44(T_{OX}(t))$; and, a width $W_{OX}(t) = W_{Si}(0) + \text{about } 0.88(T_{OX}(t))$.

Minor variations in the values are possible, as explained above, due to doping, geometries, and oxidation conditions.

In another aspect, forming the Si feature in Step 1306 includes forming a plurality of adjacent Si features, where adjacent Si feature perimeters are separated by a trench width (S(0)). Then, Step 1310 forms a plurality of adjacent Si oxide features separated by trench width (S(t)), where S(t)≤S(0). In one variation, S(t)=0. If Step 1306 forms Si features having a width $W_{Si}(0)$=about 1.2728 S(0), Step 1310 forms adjacent silicon oxide features sharing coincident perimeters. If Step 1306 forms Si features having a width $W_{Si}(0)$>about 1.2728 S(0), then Step 1310 forms an amorphously merged silicon oxide feature with a planar top surface. Again, minor variations in these values are possible, as explained above, due to doping, crystallographic orientation, geometries, and oxidation conditions. The silicon oxide features have a height ($H_{OX}(t)$) responsive to the trench width (S(0)), the Si feature width ($W_{Si}(t)$), and the Si feature aspect ratio. In one example, growing silicon oxide in Step 1308 includes growing a thickness of silicon oxide in a range of 1 to 2 microns (in a single oxidation step), and forming the silicon oxide features in Step 1310 includes forming a silicon oxide layer having a thickness of at least 5 microns, with thicknesses as great as 25, 50, and even 100 microns being possible. In other words, a silicon oxide layer as thick as the device layer can be formed.

In one aspect, prior to using the DREI process, Step 1303 masks regions of the Si layer top surface to form Si sidewalls, and Step 1310 forms silicon oxide features with a perimeter adjacent to the Si sidewalls. In one example, the Si oxide feature formed has a height $H_{OX}(t)$ of 50 microns and a width $W_{OX}(t)$ of 2 microns between adjacent Si sidewalls. Then, the method comprises the additional steps. Step 1312 applies a voltage potential to the Si sidewalls and Step 1314 measures a breakdown voltage of greater than 2000 volts.

In another aspect, oxidizing the Si feature in Step 1308 includes retaining a Si core internal to the silicon oxide feature, with a proximal end extending from the substrate top surface, a distal end, a height ($H_{Si}(t)$), a perimeter, and a width ($W_{Si}(t)$), as measured in a cross-section of the perimeter at the proximal end, where:

$$W_{Si}(t)=W_{Si}(0)-\text{about } 1.12(T_{OX}(t)); \text{ and,}$$

$$H_{Si}(t)=H_{Si}(0)-\text{about } 0.56(T_{OX}(t)).$$

In one aspect, the Si core has with an aspect ratio of height to width of greater than 5:1. As explained above, minor variations in these values may be a result of doping, geometries, crystallographic orientation, and oxidation conditions.

In one aspect, forming the Si feature(s) in Step 1306 includes forming a series of scallops along the height of the Si feature, where each scallop is responsive to a DREI etching step.

Figure 14:
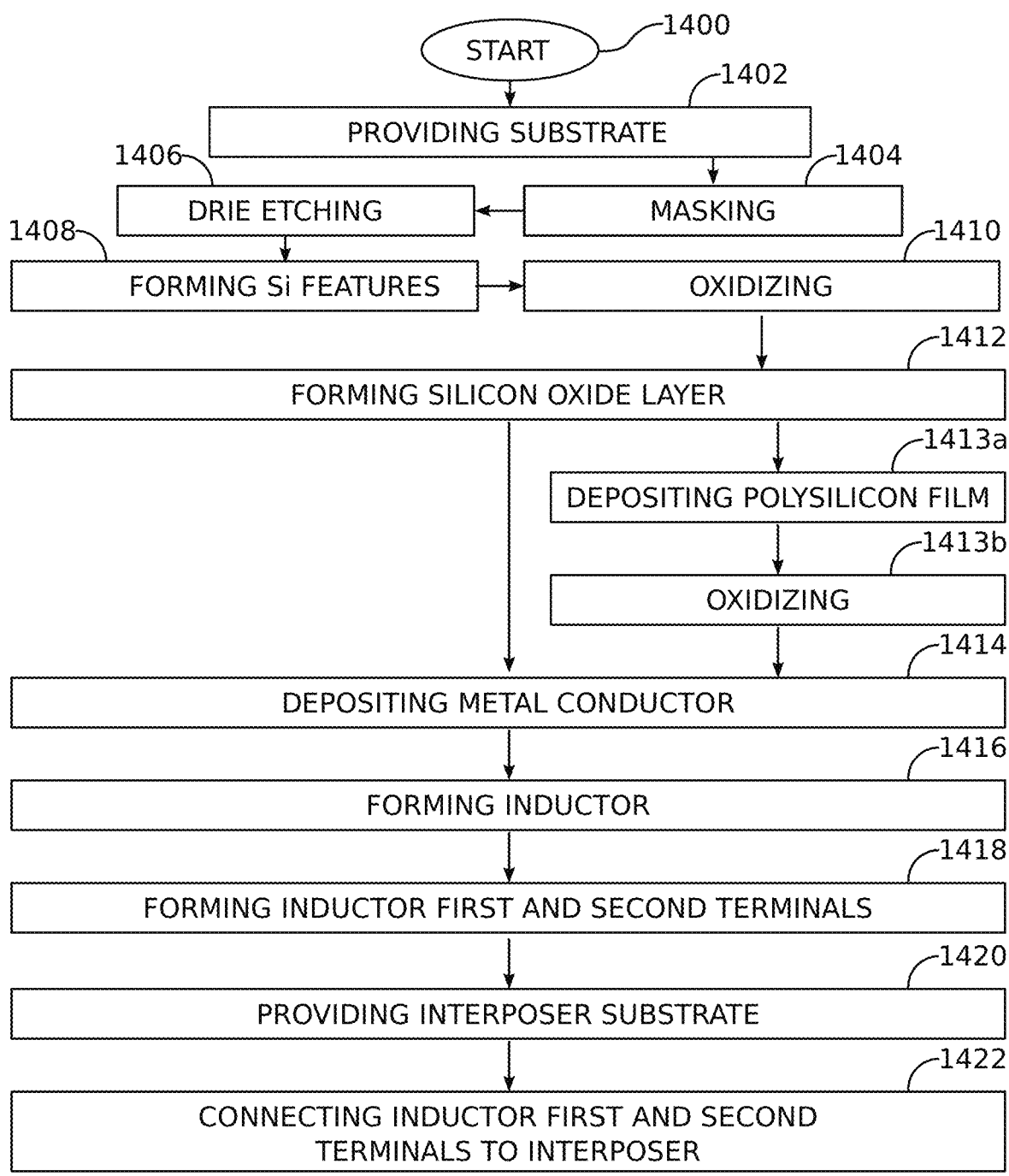
FIG. 14 is a flowchart illustrating a method for fabricating a silicon oxide embedded inductor.

FIG. 14 is a flowchart illustrating a method for fabricating a silicon oxide embedded inductor. The method begins at Step 1400. Step 1402 provides a substrate having a top surface, with an overlying silicon layer having a top surface. Step 1404 masks the silicon layer top surface with a coating (e.g., photoresist) to form a first plurality of exposed regions having a width $S_1(0)$ and an exposed path region having a width $S_2(0)$, where $S_2(0)>S_1(0)$. For example, the path may be in the form of a spiral with a depth-to-width ratio of greater than 5. Using a DREI process, Step 1406 etches exposed regions of the Si. In response to the DREI process, Step 1408 forms a plurality of Si features with a proximal end extending from the substrate top surface, a distal end, a height ($H_{Si}(0)$), a perimeter, a width ($W_{Si}(0)$), as measured in a cross-section of the perimeter at the proximal end. The difference of width between the proximal and distal ends is typically less than 10%. In one aspect, the Si features may have an aspect ratio of height to width of greater than 5:1. The silicon features may include a series of scallops along the height of the Si features, where each scallop is responsive to a DREI etching step.

Step 1410 grows a silicon oxide ($SiO_2$) film overlying the Si features having a thickness ($T_{OX}(t)$). Step 1412 forms a silicon oxide layer from silicon oxide features having a proximal end extending from the substrate top surface, a distal end, a height, a perimeter, and a width, as measured in a cross-section of the perimeter at the proximal end. The difference of width between the proximal and distal ends is typically less than 10%, and where $W_{OX}(t)$ is about equal to $S_1(0)/2$. In one aspect, the silicon oxide features have an aspect ratio of height to width of greater than 5:1. Step 1414 deposits a metal conductor covering the silicon oxide feature sidewalls and trench bottom associated with the exposed path region. Step 1416 forms an electrically conductive path embedded in the silicon oxide layer.

In one aspect, forming the electrically conductive path in Step 1416 includes forming metal conductor wings extending from the silicon oxide sidewalls over the silicon oxide layer top surface. Alternatively or in addition, the metal conductor completely fills the trench between the silicon oxide sidewalls with the metal conductor.

In another aspect, Step 1418 forms a first electrical terminal on a silicon oxide layer top surface at a first end of the electrically conductive path, and forms a second electrical terminal on the silicon oxide layer top surface at a second end of the electrically conductive path.

Step 1420 may also provide an interposer substrate having a top surface with a first terminal and a second terminal, a bottom surface with a first electrical interface connected to the interposer substrate first terminal through a via, and a second electrical interface connected to the interposer substrate second terminal through a via. Then, Step 1422 forms a first electrically conductive connection between the first electrical interface and the inductor first terminal, and forms a second electrical connection between the second electrical interface and the inductor second terminal.

In one aspect, forming the silicon oxide layer in Step 1412 includes forming an amorphously merged Si oxide layer from the plurality of silicon oxide features. Alternatively, Step 1412 forms the silicon oxide layer from silicon oxides features having an internal Si core with a proximal end extending from the substrate top surface, a distal end, a height ($H_{Si}(t)$), a perimeter, and a width ($W_{Si}(t)$), as measured in a cross-section of the perimeter at the proximal end. In one aspect, the Si core has an aspect ratio of height to width of greater than 5:1.

In another aspect, forming the silicon oxide layer in Step 1412 includes forming silicon oxide features having a height ($H_{OX}(t)$) responsive to the trench width ($S_1(0)$), the Si feature width ($W_{Si}(t)$), and the Si feature aspect ratio (see Table 4).

In one other aspect, forming the silicon oxide layer in Step 1412 includes forming the silicon oxide layer from silicon oxide features separated by a trench width S(t)>0. Then, the method may comprise additional steps. Step 1413a deposits a Si film overlying the silicon oxide features, and Step 1413b oxidizes the Si film to form a planar silicon oxide layer top surface.

Thick oxide structures, a silicon oxide embedded inductor, and associated fabrication processes have been provided. Examples of particular geometries and process steps have been presented to illustrate the invention. However, the invention is not limited to merely these examples. Other variations and embodiments of the invention will occur to those skilled in the art.

I claim:

1. A silicon oxide structure comprising:
   a substrate having a top surface;
   a silicon oxide ($SiO_2$) feature with a proximal end extending from the substrate top surface, a distal end, a height ($H_{OX}(t)$), a perimeter, a width ($W_{OX}(t)$), as measured in a cross-section of the perimeter at the proximal end, where the difference of width between the proximal and distal ends is less than 10%;
   a plurality of adjacent silicon oxide features having perimeters separated by a trench width ($S(t)$), where $S(t)=0$; and
   a Si core internal to the silicon oxide feature, with a proximal end extending from the substrate top surface, a distal end, a height ($H_{Si}(t)$), a perimeter, a width ($W_{Si}(t)$), as measured in a cross-section of the perimeter at the proximal end, where the difference of width between the proximal and distal ends is less than 10%;
   wherein $H_{OX}(t)=H_{Si}(t)+$silicon oxide thickness ($T_{OX}(t)$); and,
   wherein $W_{OX}(t)=W_{Si}(t)+2(T_{OX}(t))$.

2. The silicon oxide structure of claim 1 further comprising:
   a plurality of adjacent silicon oxide features having perimeters separated by a trench width ($S(t)$), where $S(t)>0$.

3. The silicon oxide structure of claim 1 wherein adjacent silicon oxide features share coincident perimeters.

4. The silicon oxide structure of claim 3 wherein the adjacent silicon oxide features with shared coincident perimeters form an amorphously merged silicon oxide layer having a planar top surface.

5. The silicon oxide structure of claim 1 further comprising:
   a plurality of adjacent silicon oxide features;
   Si sidewalls having a height ($H_{Si}(t)$); and,
   wherein the plurality of silicon oxide features are interposed between the Si sidewalls.

6. The silicon oxide structure of claim 1 wherein the silicon oxide feature has a perimeter in a shape selected from a group consisting of a circle, a square, a rectangle, a polygon, a ridge, and a shaped ridge.

7. The silicon oxide structure of claim 1 wherein the silicon oxide feature has an aspect ratio of height ($H_{ox}(t)$) to width ($W_{ox}(t)$) of greater than 5:1.

8. A silicon oxide ($SiO_2$) embedded inductor comprising:
   a substrate with a top surface;
   a silicon oxide layer formed overlying the substrate top surface having a top surface;
   a trench formed in the silicon oxide layer having a path length, sidewalls, a depth ($D_T$), and a width ($W_T$), as measured at the trench bottom, where the difference of width between a trench opening at the silicon oxide layer top surface and trench bottom is less than 10%; and,
   a metal conductor covering the trench sidewalls and trench bottom;
   wherein the silicon oxide layer comprises a plurality of Si oxide features having coincident perimeters;
   wherein the silicon oxide features comprise an internal Si core with a proximal end extending from the substrate top surface, a distal end, a height ($H_{Si}(t)$), a perimeter, and a width ($W_{Si}(t)$), as measured in a cross-section of the perimeter at the proximal end.

9. The inductor of claim 8 wherein the metal conductor includes wings extending from the trench sidewalls over the silicon oxide layer top surface.

10. The inductor of claim 8 wherein the metal conductor completely fills the trench.

11. The inductor of claim 8 further comprising:
    a first electrical terminal formed on the silicon oxide layer top surface at a first end of the metal conductor, and a second electrical terminal formed on the silicon oxide layer top surface at a second end of the metal conductor.

12. The inductor of claim 11 further comprising:
    an interposer substrate having a top surface with a first electrically conductive terminal and a second electrically conductive terminal, a bottom surface with a first electrical interface connected to the interposer substrate first terminal through a via, and a second electrical interface connected to the interposer substrate second terminal through a via; and,
    a first electrical connection formed between the first electrical interface and the inductor first terminal; and,
    a second electrical connection formed between the second electrical interface and the inductor second terminal.

13. The inductor of claim 8 wherein the trench path length is formed as a spiral.

14. The inductor of claim 8 wherein the plurality of Si oxide features are amorphously merged silicon oxide layer having a planar top surface.

15. The inductor of claim 8 wherein the trench has an aspect ratio of depth-to-width of greater than 5:1.

* * * * *